(12) United States Patent
Yoshimochi

(10) Patent No.: US 10,804,361 B2
(45) Date of Patent: Oct. 13, 2020

(54) NITRIDE SEMICONDUCTOR DEVICE

(71) Applicant: ROHM CO., LTD., Kyoto (JP)

(72) Inventor: Kenichi Yoshimochi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/353,106

(22) Filed: Mar. 14, 2019

(65) Prior Publication Data

US 2019/0296112 A1 Sep. 26, 2019

(30) Foreign Application Priority Data

Mar. 22, 2018 (JP) .................................. 2018-054896

(51) Int. Cl.

| | |
|---|---|
| H01L 29/20 | (2006.01) |
| H01L 29/205 | (2006.01) |
| H01L 29/778 | (2006.01) |
| H01L 21/02 | (2006.01) |
| H01L 29/423 | (2006.01) |
| H01L 29/40 | (2006.01) |
| H01L 29/417 | (2006.01) |

(52) U.S. Cl.
CPC ...... *H01L 29/2003* (2013.01); *H01L 21/0254* (2013.01); *H01L 21/0262* (2013.01); *H01L 29/205* (2013.01); *H01L 29/402* (2013.01); *H01L 29/41725* (2013.01); *H01L 29/42356* (2013.01); *H01L 29/7787* (2013.01)

(58) Field of Classification Search
CPC . H01L 29/402; H01L 29/7787; H01L 29/205; H01L 29/41725; H01L 4175; H01L 23/481

See application file for complete search history.

(56) References Cited

U.S. PATENT DOCUMENTS

| | | | |
|---|---|---|---|
| 2006/0273347 A1 | 12/2006 | Hikita et al. | |
| 2015/0270379 A1* | 9/2015 | Kuraguchi | .......... H01L 29/7786 257/194 |
| 2016/0380093 A1* | 12/2016 | Huang | .............. H01L 29/66462 257/77 |
| 2017/0278934 A1* | 9/2017 | Kajiwara | .............. H01L 23/535 |
| 2019/0237552 A1* | 8/2019 | LaRoche | .......... H01L 21/76805 |

FOREIGN PATENT DOCUMENTS

| | | |
|---|---|---|
| JP | 2006-339561 | 12/2006 |
| JP | 2012-109366 | 6/2012 |

* cited by examiner

*Primary Examiner* — Changhyun Yi
(74) *Attorney, Agent, or Firm* — Gregory M. Howison

(57) ABSTRACT

There is provided a nitride semiconductor device, including: a Si substrate including a front surface and a back surface; a buffer layer formed over the Si substrate; a first nitride semiconductor layer formed over the buffer layer; a second nitride semiconductor layer formed over the first nitride semiconductor layer; a gate electrode disposed over the second nitride semiconductor layer; a source electrode and a drain electrode electrically connected to the second nitride semiconductor layer, and disposed over the second nitride semiconductor layer to be spaced apart from the gate electrode that is interposed between the source electrode and the drain electrode; a back surface electrode pad formed over the back surface of the Si substrate; and a conductive path formed in the Si substrate, the buffer layer, the first nitride semiconductor layer, and the second nitride semiconductor layer.

28 Claims, 22 Drawing Sheets

NITRIDE SEMICONDUCTOR DEVICE

CROSS-REFERENCE TO RELATED APPLICATIONS

This application is based upon and claims the benefit of priority from Japanese Patent Application No. 2018-054896, filed on Mar. 22, 2018, the entire contents of which are incorporated herein by reference.

TECHNICAL FIELD

The present disclosure relates to a nitride semiconductor device composed of a group III nitride semiconductor (hereinafter sometimes simply referred to as "nitride semiconductor").

BACKGROUND

The group III nitride semiconductor refers to a semiconductor which utilizes nitrogen as a group V element in a group III-V semiconductor. Typical examples thereof are aluminum nitride (AlN), gallium nitride (GaN) and indium nitride (InN). In general, the group III nitride semiconductor may be expressed as $Al_xIn_yGa_{1-x-y}N$ ($0 \leq x \leq 1$, $0 \leq y \leq 1$, and $0 \leq x+y \leq 1$).

There is known a HEMT (High Electron Mobility Transistor) using a nitride semiconductor. The HEMT includes a Si substrate, an electron transit layer formed over the Si substrate and made of GaN, and an electron supply layer formed over the electron transit layer and made of AlGaN. A pair of source and drain electrodes are formed so as to make contact with the electron supply layer, and a gate electrode is disposed between the source and drain electrodes. Due to polarization caused by lattice mismatch between GaN and AlGaN, a two-dimensional electron gas is formed in the electron transit layer at a position spaced inward by several Å from the interface between the electron transit layer and the electron supply layer. With this two-dimensional electron gas used as a channel, a source and a drain are connected to each other. When the two-dimensional electron gas is blocked by applying a control voltage to the gate electrode, the source and the drain are cut off.

In the nitride semiconductor device using the Si substrate, an electrode pad connected to the source electrode, an electrode pad connected to the drain electrode, and an electrode pad connected to the gate electrode are formed over one surface side of the nitride semiconductor device. Therefore, it is difficult to adopt a general vertical transistor package.

SUMMARY OF THE INVENTION

Some embodiments of the present disclosure provide a nitride semiconductor device capable of adopting a general vertical transistor package.

According to one or more embodiments of the present disclosure, there is provided a nitride semiconductor device, including: a Si substrate including a front surface and a back surface; a buffer layer formed over the front surface of the Si substrate; a first nitride semiconductor layer formed over the buffer layer and configured to constitute an electron transit layer; a second nitride semiconductor layer formed over the first nitride semiconductor layer and configured to constitute an electron supply layer; a gate electrode disposed over the second nitride semiconductor layer; a source electrode and a drain electrode electrically connected to the second nitride semiconductor layer, and disposed over the second nitride semiconductor layer to be spaced apart from the gate electrode that is interposed between the source electrode and the drain electrode; a back surface electrode pad formed over the back surface of the Si substrate; and a conductive path formed in the Si substrate, the buffer layer, the first nitride semiconductor layer, and the second nitride semiconductor layer, and configured to electrically connect one of the source electrode and the drain electrode to the back surface electrode pad.

According to the embodiments of the present disclosure, it is possible to adopt a general vertical transistor package.

According to the embodiments of the present disclosure, a back-surface-drawing target electrode is the one of the source electrode and the drain electrode electrically connected to the back surface electrode pad, and the conductive path includes: a contact hole extending from a position, which faces the back-surface-drawing target electrode, on the back surface of the Si substrate toward the back-surface-drawing target electrode and consecutively penetrating at least the Si substrate and the buffer layer among the Si substrate, the buffer layer, the first nitride semiconductor layer, and the second nitride semiconductor layer; and a conductive material buried in the contact hole.

According to the embodiments of the present disclosure, the contact hole consecutively penetrates the Si substrate, the buffer layer, and the first nitride semiconductor layer, without being formed in the second nitride semiconductor layer.

According to the embodiments of the present disclosure, the contact hole consecutively penetrates the Si substrate, the buffer layer, the first nitride semiconductor layer, and the second nitride semiconductor layer.

According to the embodiments of the present disclosure, a low resistance region is formed in the second nitride semiconductor layer directly under a back-surface-drawing target electrode.

According to the embodiments of the present disclosure, there is provided a nitride semiconductor device, including: a Si substrate including a front surface and a back surface; a buffer layer formed over the front surface of the Si substrate; a first nitride semiconductor layer formed over the buffer layer and configured to constitute an electron transit layer; a second nitride semiconductor layer formed over the first nitride semiconductor layer and configured to constitute an electron supply layer; a gate electrode disposed over the second nitride semiconductor layer; a source electrode and a drain electrode electrically connected to the second nitride semiconductor layer, and disposed over the second nitride semiconductor layer to be spaced apart from the gate electrode that is interposed between the source electrode and the drain electrode; a drain electrode pad formed over the back surface of the Si substrate; and a conductive path formed in the Si substrate, the buffer layer, the first nitride semiconductor layer, and the second nitride semiconductor layer, and configured to electrically connect the drain electrode to the drain electrode pad.

According to the embodiments of the present disclosure, it is possible to adopt a general vertical transistor package.

According to the embodiments of the present disclosure, the conductive path includes: a contact hole extending from a position, which faces the drain electrode, on the back surface of the Si substrate toward the drain electrode and consecutively penetrating at least the Si substrate and the buffer layer among the Si substrate, the buffer layer, the first nitride semiconductor layer, and the second nitride semiconductor layer; and a conductive material buried in the contact hole.

According to the embodiments of the present disclosure, the contact hole consecutively penetrates the Si substrate, the buffer layer, and the first nitride semiconductor layer, without being formed in the second nitride semiconductor layer.

According to the embodiments of the present disclosure, the contact hole consecutively penetrates the Si substrate, the buffer layer, the first nitride semiconductor layer, and the second nitride semiconductor layer.

According to the embodiments of the present disclosure, a low resistance region is formed in the second nitride semiconductor layer directly under the drain electrode.

According to the embodiments of the present disclosure, there is provided a nitride semiconductor device, including: a Si substrate including a front surface and a back surface; a buffer layer formed over the front surface of the Si substrate; a first nitride semiconductor layer formed over the buffer layer and configured to constitute an electron transit layer; a second nitride semiconductor layer formed over the first nitride semiconductor layer and configured to constitute an electron supply layer; a gate electrode disposed over the second nitride semiconductor layer; a source electrode and a drain electrode electrically connected to the second nitride semiconductor layer, and disposed over the second nitride semiconductor layer to be spaced apart from the gate electrode that is interposed between the source electrode and the drain electrode; a source electrode pad formed over the back surface of the Si substrate; and a conductive path formed in the Si substrate, the buffer layer, the first nitride semiconductor layer, and the second nitride semiconductor layer, and configured to electrically connect the source electrode to the source electrode pad.

According to the embodiments of the present disclosure, it is possible to adopt a general vertical transistor package.

According to the embodiments of the present disclosure, the conductive path includes: a contact hole extending from a position, which faces the source electrode, on the back surface of the Si substrate toward the source electrode and consecutively penetrating at least the Si substrate and the buffer layer among the Si substrate, the buffer layer, the first nitride semiconductor layer, and the second nitride semiconductor layer; and a conductive material buried in the contact hole.

According to the embodiments of the present disclosure, the contact hole consecutively penetrates the Si substrate, the buffer layer, and the first nitride semiconductor layer, without being formed in the second nitride semiconductor layer.

According to the embodiments of the present disclosure, the contact hole consecutively penetrates the Si substrate, the buffer layer, the first nitride semiconductor layer, and the second nitride semiconductor layer.

According to the embodiments of the present disclosure, a low resistance region is formed in the second nitride semiconductor layer directly under the source electrode.

According to the embodiments of the present disclosure, the nitride semiconductor device includes a source field plate disposed between the gate electrode and the drain electrode and electrically connected to the source electrode.

According to the embodiments of the present disclosure, the first nitride semiconductor layer is formed of a GaN layer, and the second nitride semiconductor layer is formed of an AlGaN layer.

According to the embodiments of the present disclosure, the buffer layer includes a laminated film of an AlN layer formed over the front surface of the Si substrate and an AlGaN layer laminated on the AlN layer.

According to the embodiments of the present disclosure, the buffer layer includes an AlN layer or an AlGaN layer.

According to the embodiments of the present disclosure, there is provided a nitride semiconductor device, including: a Si substrate including a front surface and a back surface; a buffer layer formed over the front surface of the Si substrate; a first nitride semiconductor layer formed over the buffer layer and configured to constitute an electron transit layer; a second nitride semiconductor layer formed over the first nitride semiconductor layer and configured to constitute an electron supply layer; a gate portion disposed over the second nitride semiconductor layer; a source electrode and a drain electrode electrically connected to the second nitride semiconductor layer and disposed over the second nitride semiconductor layer, the source electrode formed to cover the gate portion; a drain electrode pad formed over the back surface of the Si substrate; and a conductive path formed in the Si substrate, the buffer layer, the first nitride semiconductor layer, and the second nitride semiconductor layer, and configured to electrically connect the drain electrode to the drain electrode pad, wherein the gate portion includes a nitride semiconductor gate layer disposed over the second nitride semiconductor layer and containing an acceptor type impurity, and a gate electrode disposed over the nitride semiconductor gate layer.

According to the embodiments of the present disclosure, it is possible to adopt a general vertical transistor package.

According to the embodiments of the present disclosure, there is provided a nitride semiconductor device, including: a Si substrate including a front surface and a back surface; a buffer layer formed over the front surface of the Si substrate; a first nitride semiconductor layer formed over the buffer layer and configured to constitute an electron transit layer; a second nitride semiconductor layer formed over the first nitride semiconductor layer and configured to constitute an electron supply layer; a gate portion disposed over the second nitride semiconductor layer; a source electrode and a drain electrode electrically connected to the second nitride semiconductor layer and disposed over the second nitride semiconductor layer, the source electrode formed to cover the gate portion; a source electrode pad formed over the back surface of the Si substrate; and a conductive path formed in the Si substrate, the buffer layer, the first nitride semiconductor layer, and the second nitride semiconductor layer, and configured to electrically connect the source electrode to the source electrode pad, wherein the gate portion includes a nitride semiconductor gate layer disposed over the second nitride semiconductor layer and containing an acceptor type impurity, and a gate electrode disposed over the nitride semiconductor gate layer.

DETAILED DESCRIPTION OF THE PREFERRED EMBODIMENTS

Figure 1:
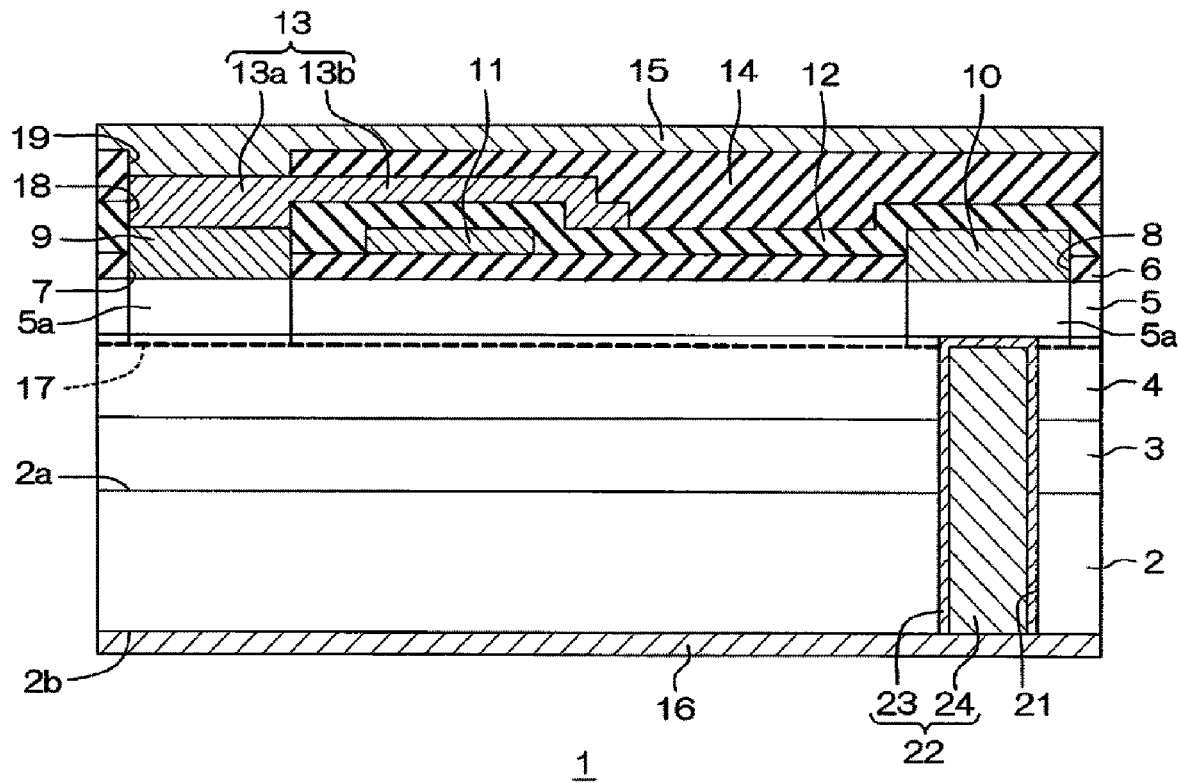
FIG. 1 is a sectional view for explaining a configuration of a nitride semiconductor device according to a first embodiment of the present disclosure.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

FIG. 1 is a sectional view for explaining a configuration of a nitride semiconductor device according to a first embodiment of the present disclosure.

The nitride semiconductor device 1 includes a substrate 2, a buffer layer 3 formed over a front surface 2a of the substrate 2, a first nitride semiconductor layer 4 epitaxially grown on the buffer layer 3, and a second nitride semiconductor layer 5 epitaxially grown on the first nitride semiconductor layer 4.

The nitride semiconductor device 1 further includes a gate-insulating film 6 formed over the second nitride semiconductor layer 5. The nitride semiconductor device 1 further includes a source electrode 9 and a drain electrode 10 (one of which may be a back-surface-drawing target electrode), which penetrate a source electrode contact hole 7 and a drain electrode contact hole 8 formed in the gate-insulating film 6 and make ohmic contact with the second nitride semiconductor layer 5. The source electrode 9 and the drain electrode 10 are spaced apart from each other.

The nitride semiconductor device 1 further includes a gate electrode 11 formed over the gate-insulating film 6. The gate electrode 11 is disposed between the source electrode 9 and the drain electrode 10.

The nitride semiconductor device 1 further includes a first interlayer-insulating film 12 which covers the gate-insulating film 6, the gate electrode 11, and the drain electrode 10, a source field plate 13 formed over the first interlayer-insulating film 12, and a second interlayer-insulating film 14 which covers the first interlayer-insulating film 12 and the source field plate 13. The nitride semiconductor device 1 further includes a source electrode pad 15 formed over the second interlayer-insulating film 14 and a drain electrode pad 16 formed over a back surface 2b of the substrate 2. In addition to the source electrode pad 15, a gate electrode pad (not shown) is formed over the second interlayer-insulating film 14.

In the present embodiment, the substrate 2 is a low resistance silicon substrate. The low resistance silicon substrate may have an impurity concentration of, for example, $1 \times 10^{17}$ cm$^{-3}$ to $1 \times 10^{20}$ cm$^{-3}$ (more specifically, about $1 \times 10^{18}$ cm$^{-3}$). The thickness of the substrate 2 is about 30 µm to 300 µm.

The buffer layer 3 is a buffer layer for alleviating distortion caused by a difference between the lattice constant of the first nitride semiconductor layer 4 formed over the buffer layer 3 and the lattice constant of the substrate 2. In the present embodiment, the buffer layer 3 is composed of a multilayer buffer layer obtained by laminating a plurality of nitride semiconductor films. In the present embodiment, the buffer layer 3 is composed of a laminated film of an AlN film making contact with the front surface 2a of the substrate 2 and an AlGaN film laminated on the front surface (the surface opposite to the substrate 2) of the AlN film. The buffer layer 3 may be composed of an AlN film alone or an AlGaN alone.

The first nitride semiconductor layer 4 constitutes an electron transit layer. In the present embodiment, the first nitride semiconductor layer 4 is formed of an n-type GaN layer doped with a donor type impurity and has a thickness of about 1.0 µm to 10 µm. The first nitride semiconductor layer 4 may be composed of an undoped GaN layer.

The second nitride semiconductor layer 5 constitutes an electron supply layer. The second nitride semiconductor layer 5 is made of a nitride semiconductor having a larger band gap than the first nitride semiconductor layer 4. Specifically, the second nitride semiconductor layer 5 is made of a nitride semiconductor having a higher Al composition than the first nitride semiconductor layer 4. In the nitride semiconductor, the band gap becomes larger as the Al composition becomes higher. In the present embodiment, the second nitride semiconductor layer 5 is formed of an $Al_{x1}Ga_{1-x1}N$ layer (0<x1<1) and has a thickness of about 10 nm to 100 nm.

In this manner, the first nitride semiconductor layer 4 (electron transit layer) and the second nitride semiconductor layer 5 (electron supply layer) are made of nitride semiconductors having different band gaps (Al compositions). Lattice mismatch occurs between the first nitride semiconductor layer 4 and the second nitride semiconductor layer 5. Due to spontaneous polarization of the first nitride semiconductor layer 4 and the second nitride semiconductor layer 5 and piezo-polarization caused by lattice mismatch between the first nitride semiconductor layer 4 and the second nitride semiconductor layer 5, the energy level of the conduction band of the first nitride semiconductor layer 4 at the interface between the first nitride semiconductor layer 4 and the second nitride semiconductor layer 5 becomes lower than the Fermi level. As a result, the two-dimensional electron gas (2DEG) layer 17 expands at a position close to the interface between the first nitride semiconductor layer 4 and the second nitride semiconductor layer 5 (for example, a position spaced apart by several A from the interface).

The gate-insulating film 6 is formed over substantially the entire region of the surface of the second nitride semiconductor layer 5. In the present embodiment, the gate-insulating film 6 is made of $SiO_2$. The thickness of the gate-insulating film 6 is about 10 nm to 100 nm. The gate-insulating film 6 may be made of SiN, SiON, $Al_2O_3$, AlN, AlON, HfO, HfN, HfON, HfSiON, AlON, or the like, in addition to $SiO_2$.

The source electrode 9 and the drain electrode 10 are composed of, for example, a Ti/AlSiCu/Ti/TiN laminated film in which a Ti film, an AlSiCu film, a Ti film, and a TiN film are laminated in this order from the lower layer. The thickness of the Ti film on the lower layer side is, for example, about 50 nm. The thickness of the AlSiCu film is, for example, about 1000 nm. The thickness of the Ti film on the upper layer side is, for example, about 20 nm. The thickness of the TiN film is, for example, about 50 nm.

The gate electrode 11 is formed to make contact with the surface of the gate-insulating film 6. The gate electrode 11 is disposed so as to be biased toward the source electrode contact hole 7. The gate electrode 11 is composed of, for example, a Ti/AlSiCu/Ti/TiN laminated film in which a Ti film, an AlSiCu film, a Ti film, and a TiN film are laminated in this order from the lower layer. The thickness of the Ti film on the lower layer side is, for example, about 50 nm. The thickness of the AlSiCu film is, for example, about 1000 nm. The thickness of the Ti film on the upper layer side is, for example, about 20 nm. The thickness of the TiN film is, for example, about 50 nm.

The first interlayer-insulating film 12 covers the front surface of the gate-insulating film 6, the side surface and the front surface of the gate electrode 11, the side surface (excluding the region covered with the gate-insulating film 6) of the source electrode 9, and the side surface (excluding the region covered with the insulating film 6) and the front surface of the drain electrode 10. In the present embodiment, the first interlayer-insulating film 12 is formed of a $SiO_2$ film and has a thickness of about 0.5 µm to 1.0 µm. In the first interlayer-insulating film 12, a field plate opening 18 for exposing the front surface of the source electrode 9 is formed at a position facing the source electrode 9. The first interlayer-insulating film 12 may be made of SiN or the like, in addition to $SiO_2$.

A source field plate 13 covering the field plate opening 18 is formed over the first interlayer-insulating film 12. A part of the source field plate 13 enters the field plate opening 18 and is connected to the source electrode 9 within the field plate opening 18.

The source field plate 13 includes a base portion 13a formed over the surface of the source electrode 9 and a plate portion 13b extending from the base portion 13a toward the drain electrode 10 through the upper side of the gate electrode 11. The plate portion 13b has a portion disposed between the gate electrode 11 and the drain electrode 10. The source field plate 13 is provided to alleviate electric field concentration on the end portion of the gate electrode 11. The source field plate 13 is formed of, for example, a TiN film, a Ti film, an Al film, or the like. The thickness of the plate portion 13b of the source field plate 13 is, for example, about 100 nm.

The second interlayer-insulating film 14 covers the first interlayer-insulating film 12 and the source field plate 13. In the present embodiment, the second interlayer-insulating film 14 is formed of a $SiO_2$ film and has a thickness of 0.5 µm to 1.0 µm. A source pad opening 19 for exposing the surface of the base portion 13a of the source field plate 13 is formed in the second interlayer-insulating film 14.

A source electrode pad 15 covering the source pad opening 19 is formed over the second interlayer-insulating film 14. The source electrode pad 15 is formed on substantially the entire region of the second interlayer-insulating film 14. A part of the source electrode pad 15 enters the source pad opening 19 and is connected to the base portion 13a of the source field plate 13 within the source pad opening 19. Accordingly, the source electrode pad 15 is electrically connected to the source electrode 9 via the base portion 13a of the source field plate 13. The source electrode pad 15 is formed of, for example, an Al film, an AlCu film, or the like.

On the second interlayer-insulating film 14, there is a removal region where the source electrode pad 15 is not formed. A gate electrode pad (not shown) is formed in the removal region. The gate electrode pad is electrically connected to the gate electrode 11 via a gate wiring (not shown).

In the second nitride semiconductor layer 5, a low resistance region 5a, in which Al is diffused, is formed in a region directly under the source electrode 9 and a region directly under the drain electrode 10. In the present embodiment, the low resistance region 5a also extends to the surface layer portion of the first nitride semiconductor layer 4.

Between the back surface 2b of the substrate 2 and the second nitride semiconductor layer 5, there is formed a drain pad contact hole 21 extending from the position facing the drain electrode 10 on the back surface 2b of the substrate 2 toward the drain electrode 10 and consecutively penetrating the substrate 2, the buffer layer 3, and the first nitride semiconductor layer 4. In the present embodiment, the upper end of the drain pad contact hole 21 reaches the low resistance region 5a in the second nitride semiconductor layer 5 that is directly under the drain electrode 10.

A drain/contact plug (conductive material) 22 having its upper end connected to the low resistance region 5a in the second nitride semiconductor layer 5 directly under the drain electrode 10 is buried in the drain pad contact hole 21. The drain/contact plug 22 includes a barrier metal film 23 formed over the sidewall of the drain pad contact hole 21 and the portion of the second nitride semiconductor layer 5 facing the drain pad contact hole 21, and a metal plug 24 buried in the drain pad contact hole 21 in a state surrounded by the barrier metal film 23. The barrier metal film 23 is made of, for example, TiN. The metal plug 24 is made of, for example, Cu.

The drain electrode pad 16 is formed in substantially the entire region of the back surface 2b of the substrate 2. The drain electrode pad 16 is connected to the lower end of the drain/contact plug 22. Therefore, the drain electrode pad 16 is electrically connected to the drain electrode 10 via a conductive path formed of the drain/contact plug 22 and the low resistance region 5a in the second nitride semiconductor layer 5 directly under the drain electrode 10. The drain electrode pad 16 is made of, for example, Ni, Ag, Ti, Au, or the like.

In the nitride semiconductor device 1, a second nitride semiconductor layer 5 (electron supply layer) having a different band gap (Al composition) is formed over the first nitride semiconductor layer 4 (electron transit layer) to form a hetero-junction. Thus, a two-dimensional electron gas layer 17 is formed in the first nitride semiconductor layer 4 in the vicinity of the interface between the first nitride semiconductor layer 4 and the second nitride semiconductor layer 5. A HEMT using the two-dimensional electron gas layer 17 as a channel is formed. In a state where a control voltage is not applied to the gate electrode 11, the source electrode 9 and the drain electrode 10 are connected to each other with the two-dimensional electron gas layer 17 used as a channel. Therefore, the HEMT is of a normally turned-on type. When a control voltage for causing the potential of the gate electrode 11 to become negative with respect to the source electrode 9 is applied to the gate electrode 11, the two-dimensional electron gas layer 17 is cut off and the HEMT is turned off.

Figure 2A:
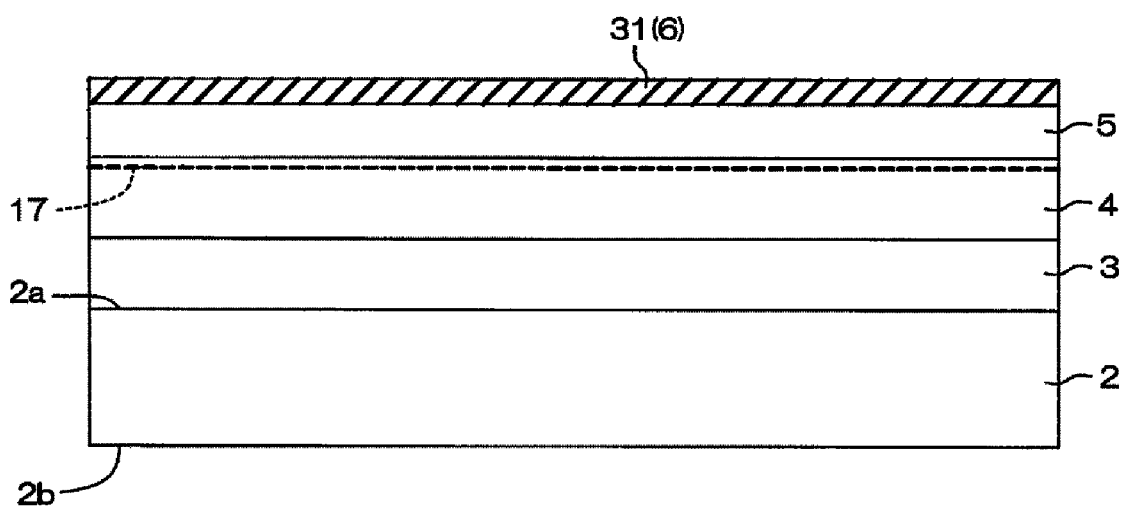
FIG. 2A is a sectional view showing an example of a manufacturing process of a nitride semiconductor device.
Figure 2B:
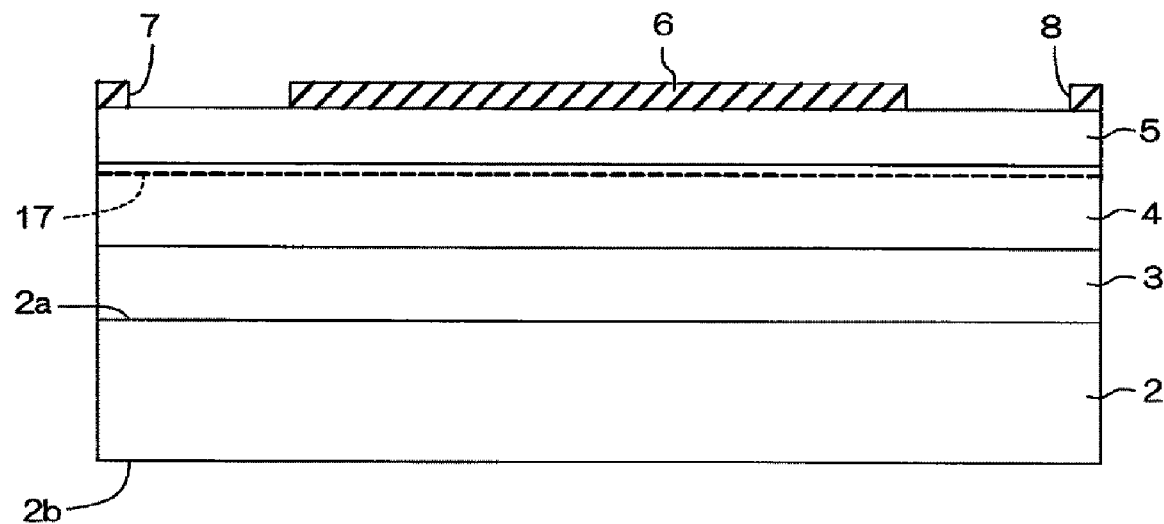
FIG. 2B is a sectional view showing a next step of FIG. 2A.
Figure 2C:
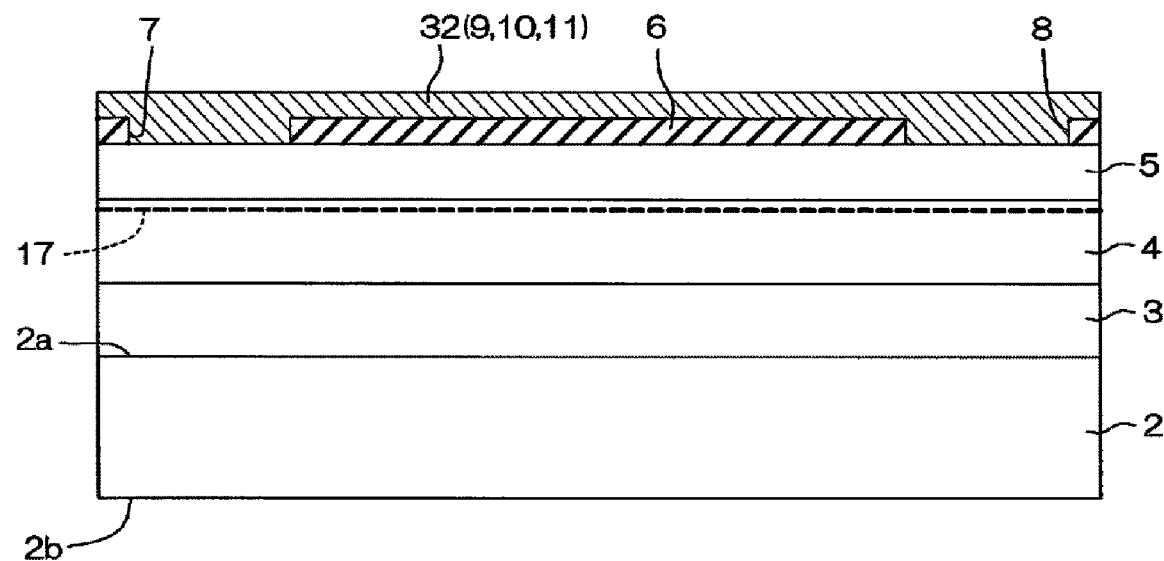
FIG. 2C is a sectional view showing a next step of FIG. 2B.
Figure 2D:
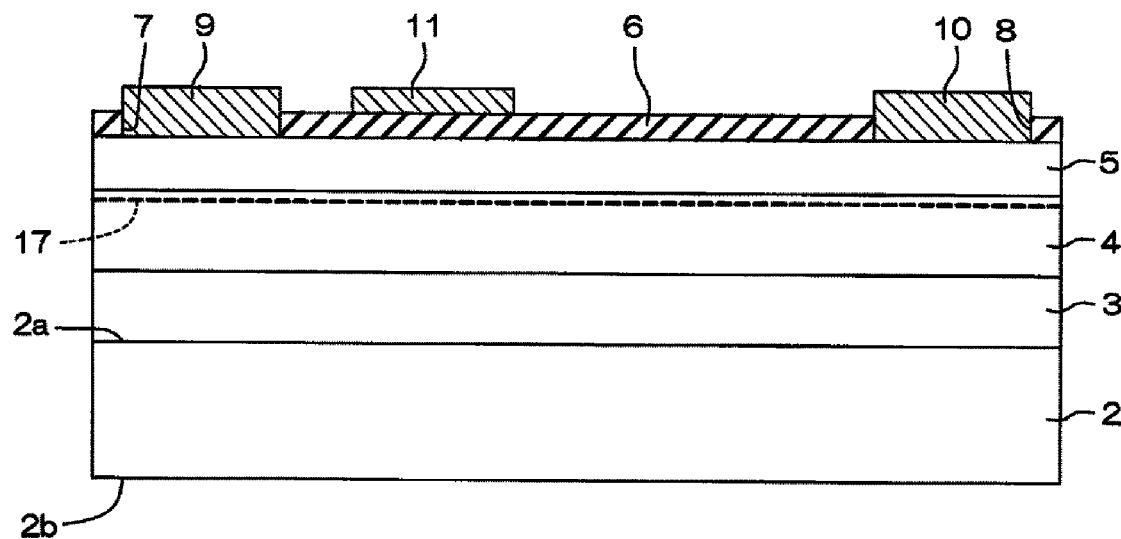
FIG. 2D is a sectional view showing a next step of FIG. 2C.
Figure 2E:
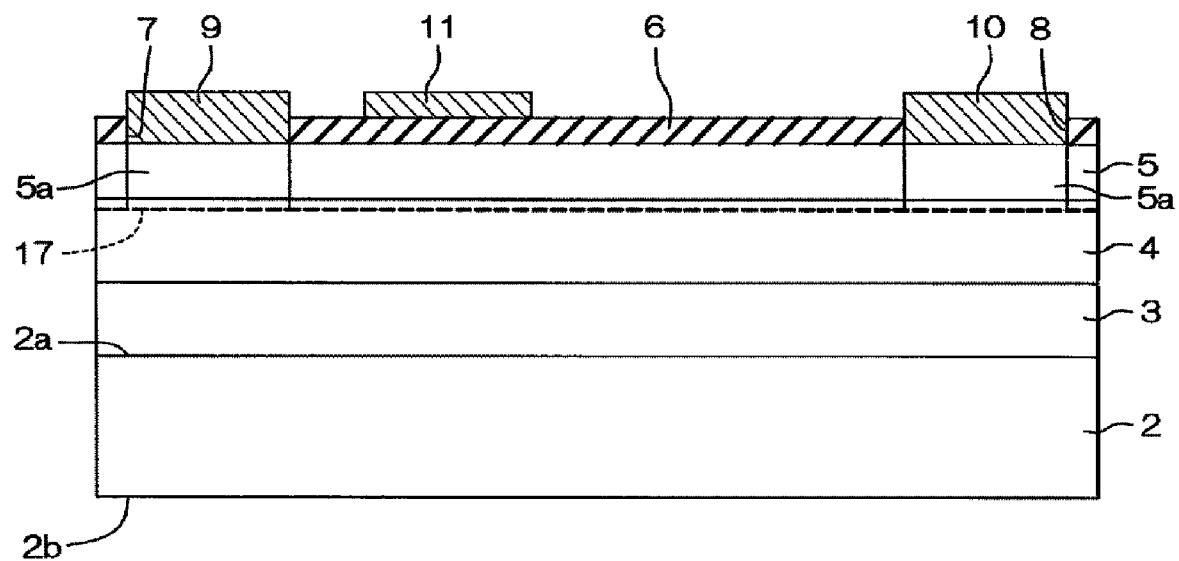
FIG. 2E is a sectional view showing a next step of FIG. 2D.
Figure 2F:
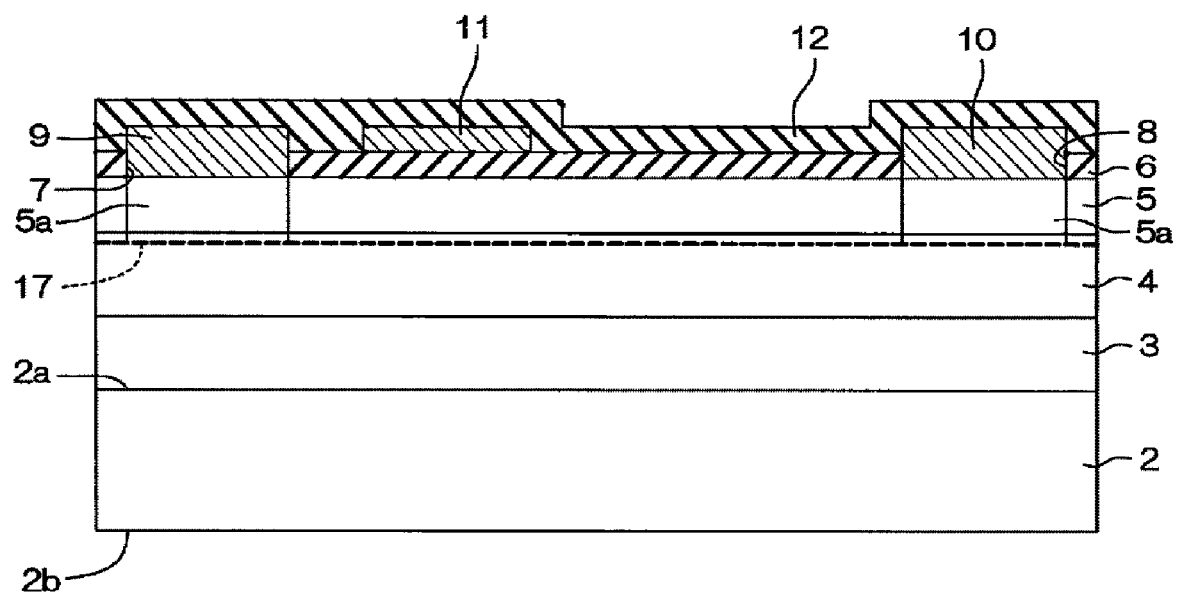
FIG. 2F is a sectional view showing a next step of FIG. 2E.
Figure 2G:
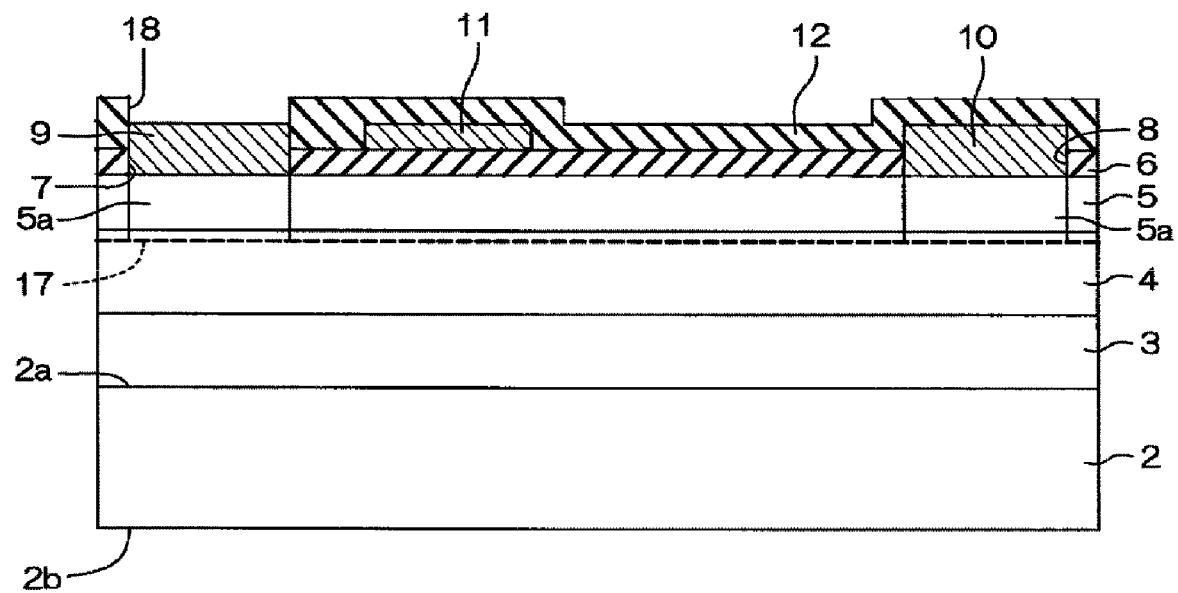
FIG. 2G is a sectional view showing a next step of FIG. 2F.
Figure 2H:
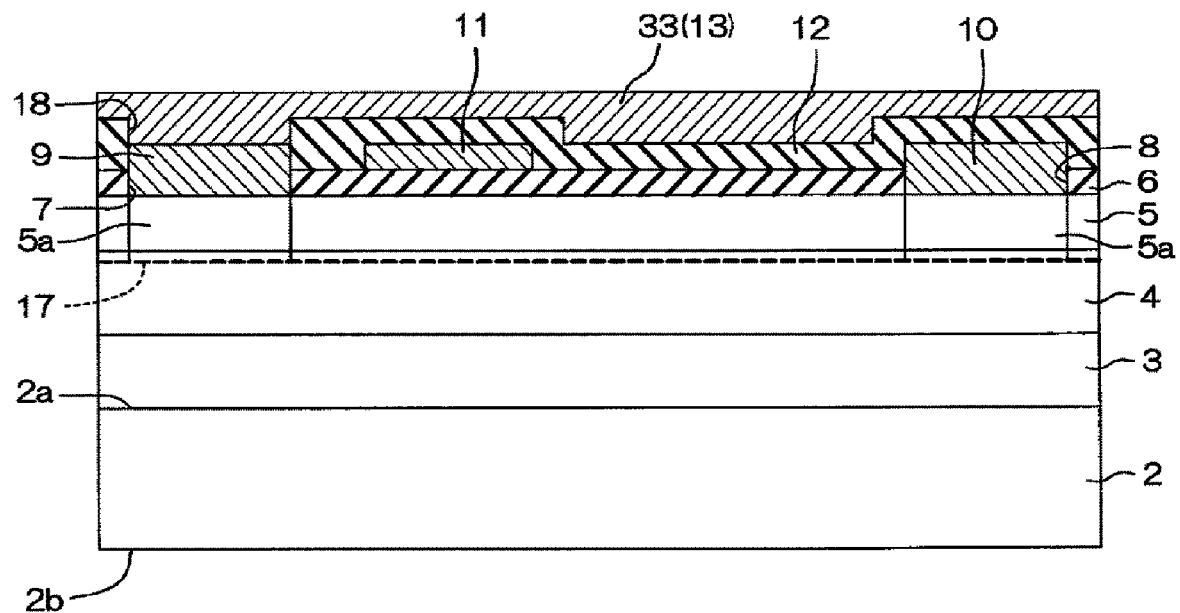
FIG. 2H is a sectional view showing a next step of FIG. 2G.
Figure 2I:
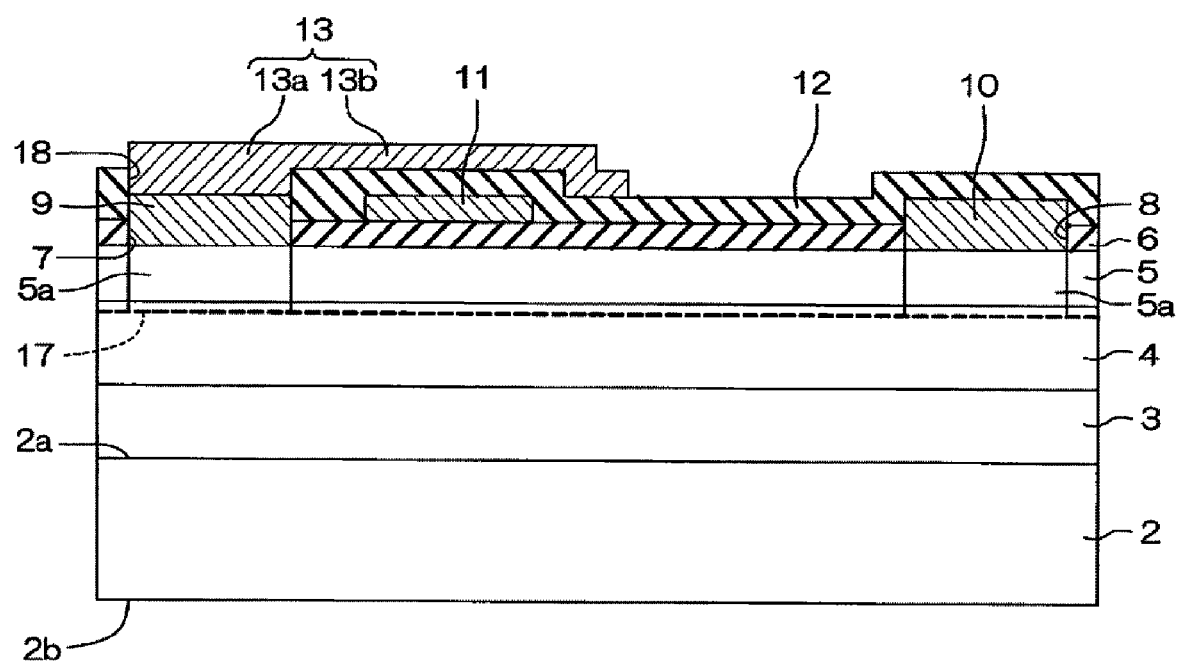
FIG. 2I is a sectional view showing a next step of FIG. 2H.
Figure 2J:
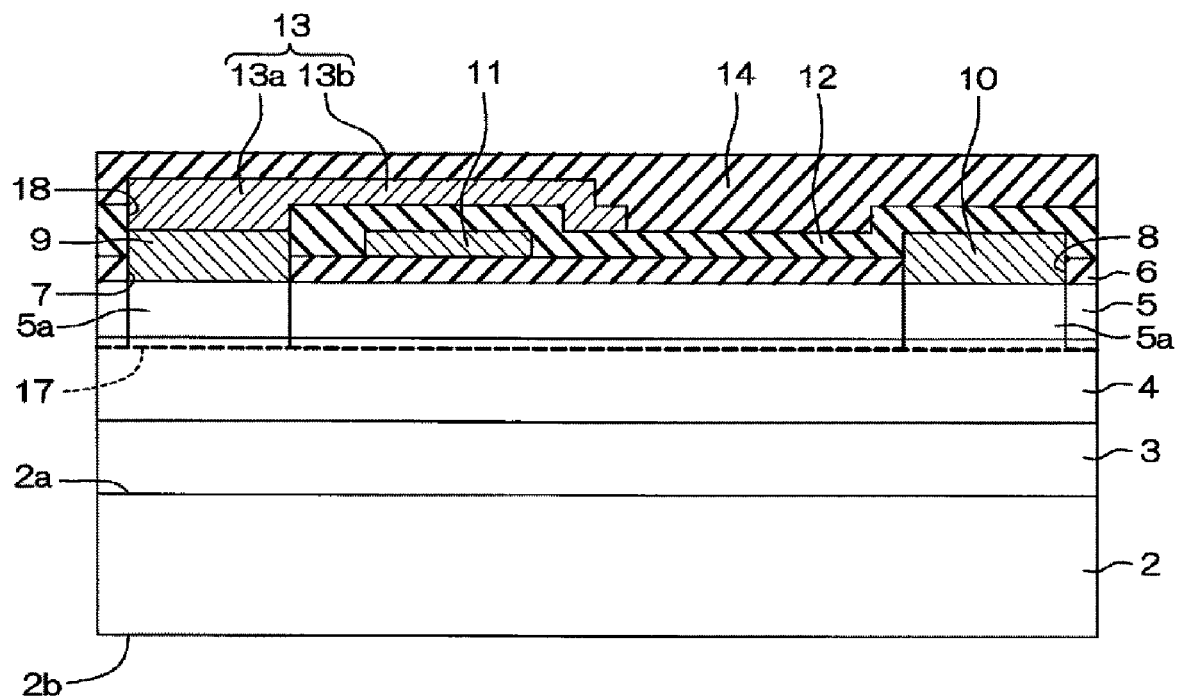
FIG. 2J is a sectional view showing a next step of FIG. 2I.
Figure 2K:
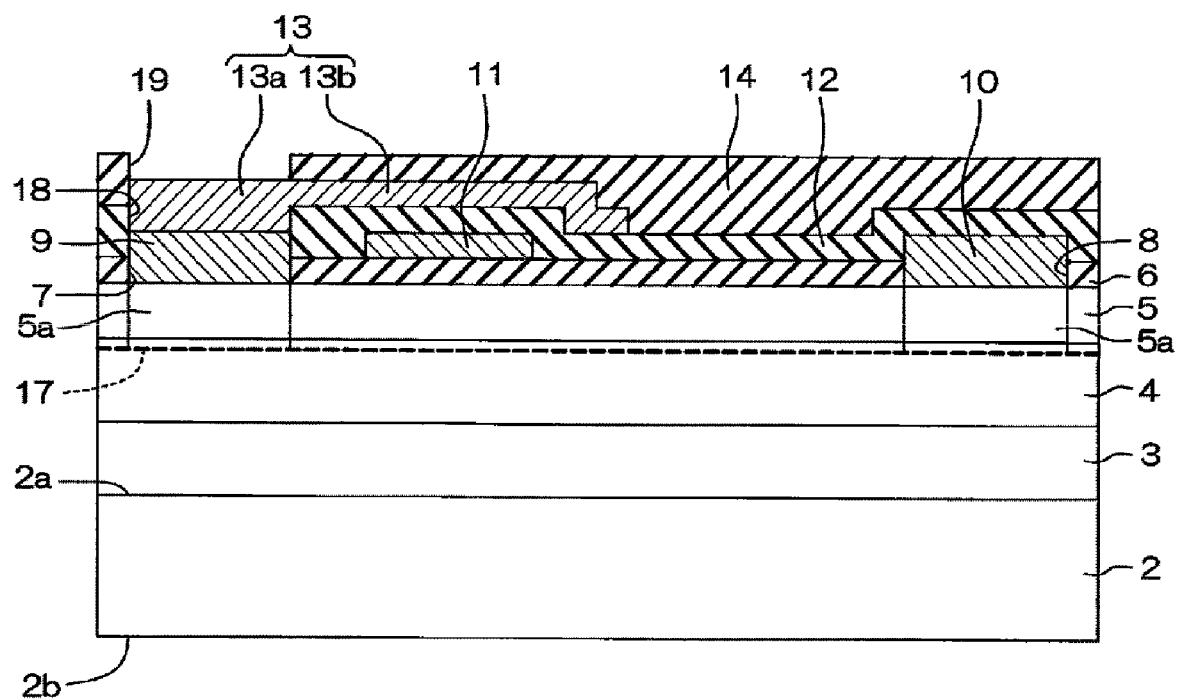
FIG. 2K is a sectional view showing a next step of FIG. 2J.
Figure 2L:
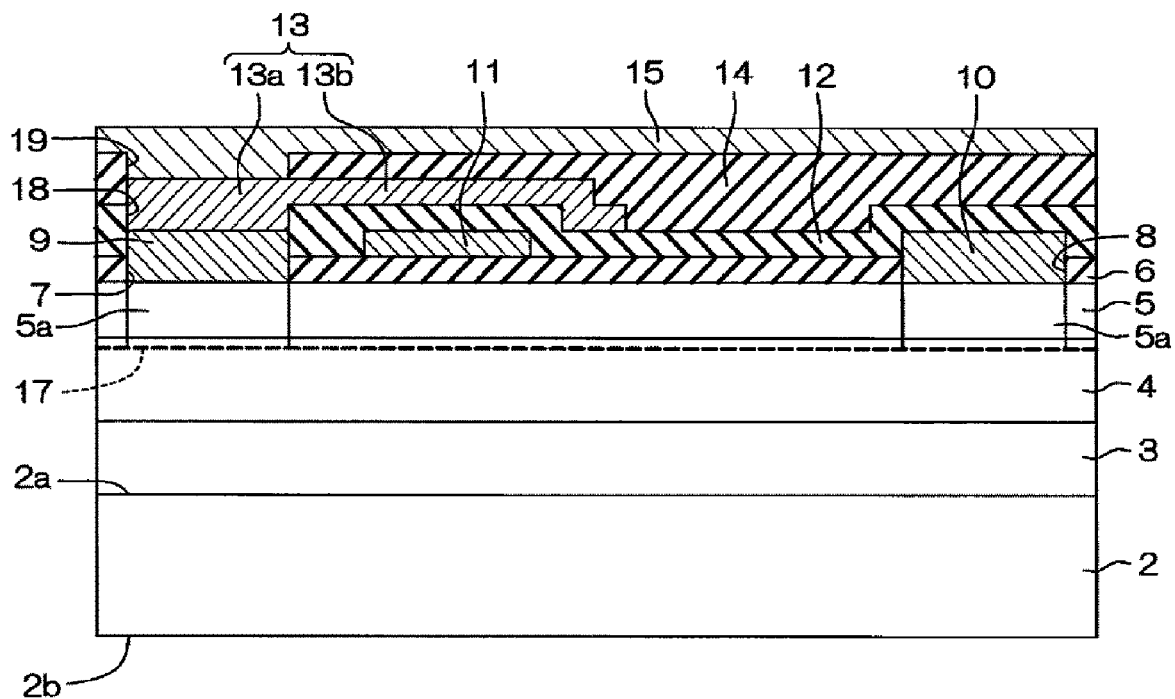
FIG. 2L is a sectional view showing a next step of FIG. 2K.
Figure 2M:
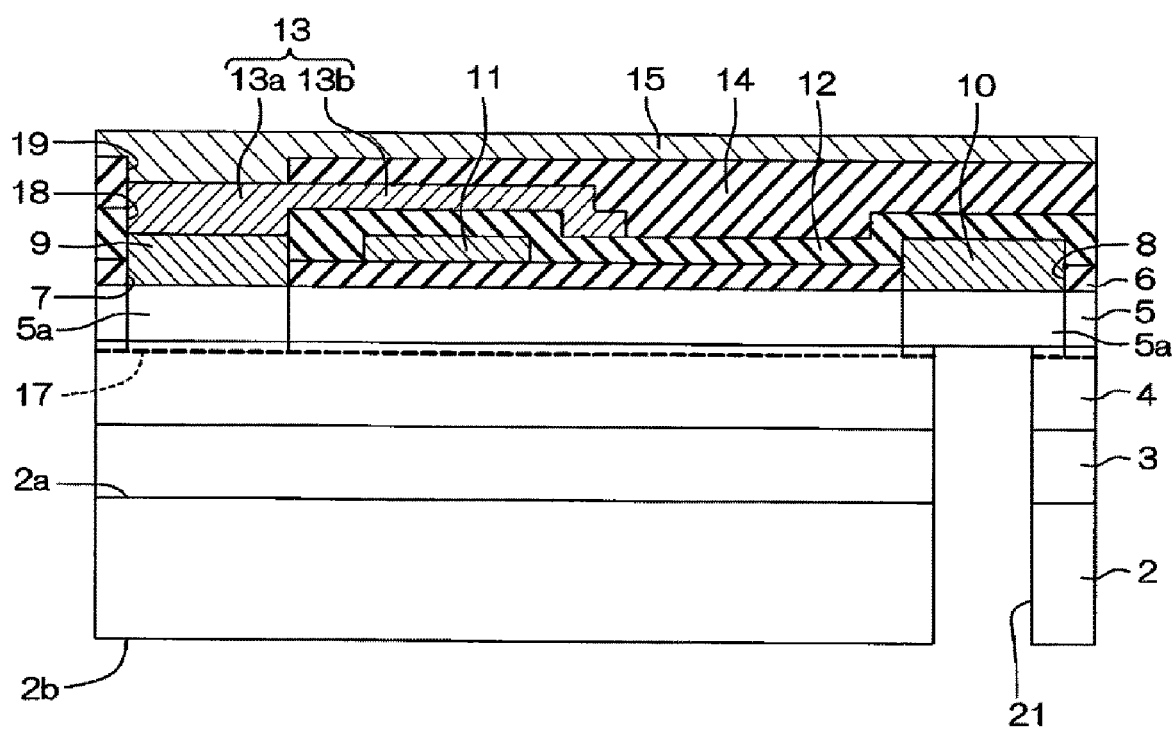
FIG. 2M is a sectional view showing a next step of FIG. 2L.
Figure 2N:
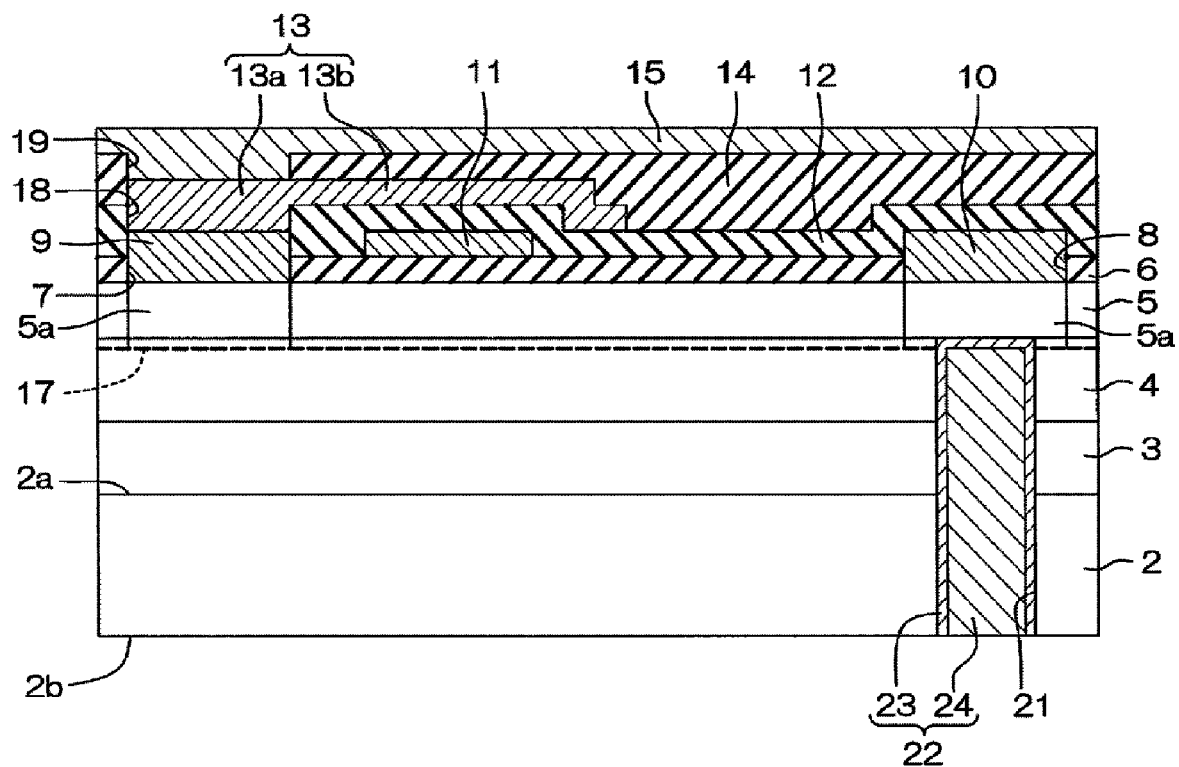
FIG. 2N is a sectional view showing a next step of FIG. 2M.

FIGS. 2A to 2N are sectional views for explaining an example of a manufacturing process of the above-described nitride semiconductor device 1 and show sectional structures in a plurality of steps in the manufacturing process.

First, as shown in FIG. 2A, a buffer layer 3 and a first nitride semiconductor layer (electron transit layer) 4 are sequentially epitaxially grown on a front surface 2a of a substrate 2 by an MOCVD (Metal Organic Chemical Vapor Deposition) method. Further, a second nitride semiconductor layer (electron supply layer) 5 is epitaxially grown on the first nitride semiconductor layer 4 by a MOCVD method. Moreover, an insulating material film 31 as a material film for a gate-insulating film 6 is formed in the second nitride semiconductor layer 5 by a plasma CVD method, an LPCVD (Low Pressure CVD) method, an ALD (Atomic Layer Deposition) method, or the like.

Next, on the insulating material film 31, a resist film is formed in a region excluding the region where a source electrode contact hole 7 and a drain electrode contact hole 8 are to be formed. By etching the insulating material film 31 via the resist film, as shown in FIG. 2B, the source electrode contact hole 7 and the drain electrode contact hole 8 are formed. Thus, the insulating material film 31 is patterned to obtain a gate-insulating film 6. The source electrode contact hole 7 and the drain electrode contact hole 8 penetrate the gate-insulating film 6 and reach the second nitride semiconductor layer 5.

Next, after the resist film is removed, as shown in FIG. 2C, an electrode film 32 which is a material film for a source electrode 9, a drain electrode 10, and a gate electrode 11 is formed over the second nitride semiconductor layer 5 by, for example, a vapor deposition method, a sputtering method or the like so as to cover the gate-insulating film 6. The electrode film 32 is composed of, for example, a Ti/AlSiCu/Ti/TiN laminated film in which a Ti film, an AlSiCu film, a Ti film, and a TiN film are laminated in this order from the lower layer.

Next, a resist film covering a region where the source electrode is to be formed, a region where the drain electrode is to be formed, and a region where the gate electrode is to be formed on the surface of the electrode film 32 is formed. Then, the electrode film 32 is selectively etched using the resist film as a mask, whereby the source electrode 9, the drain electrode 10, and the gate electrode 11 are obtained as shown in FIG. 2D.

Next, as shown in FIG. 2E, an annealing process is performed after removing the resist film, whereby the source electrode 9 and the drain electrode 10 make ohmic contact with the two-dimensional electron gas layer 17 via the second nitride semiconductor layer 5. At this time, Al contained in the source electrode 9 and the drain electrode 10 is diffused into the second nitride semiconductor layer 5. Thus, in the second nitride semiconductor layer 5, a low resistance region 5a is formed in a region directly under the source electrode 9 and a region directly under the drain electrode 10.

Next, as shown in FIG. 2F, a first interlayer-insulating film 12 is formed over the second nitride semiconductor layer 5 by a plasma CVD method or an LPCVD method so as to cover the source electrode 9, the drain electrode 10, and the gate electrode 11.

Next, a resist film covering a region other than the region facing the source electrode 9 on the surface of the first interlayer-insulating film 12 is formed. Then, the first interlayer-insulating film 12 is selectively etched using the resist film as a mask, whereby a field plate opening 18 for exposing the surface of the source electrode 9 is formed in the first interlayer-insulating film 12 as shown in FIG. 2G.

Next, after the resist film is removed, as shown in FIG. 2H, a plate film 33 as the material film of the source field plate 13 is formed over the first interlayer-insulating film 12 by, for example, a sputtering method, so as to cover the field plate opening 18. The plate film 33 is formed of, for example, a TiN film.

Next, a resist film is formed to cover the region where the source field plate is to be formed on the surface of the plate film 33. By selectively etching the plate film 33 using the resist film as a mask, as shown in FIG. 2I, it is possible to obtain a source field plate 13 including a base portion 13a formed over the source electrode 9 and a plate portion 13b extending from the base portion 13a toward the drain electrode 10.

Next, after the resist film is removed, as shown in FIG. 2J, a second interlayer-insulating film 14 is formed over the first interlayer-insulating film 12 by a plasma CVD method or an LPCVD method so as to cover the source field plate 13.

Next, a resist film is formed to cover a region other than the region facing the base portion 13a of the source field plate 13 on the surface of the second interlayer-insulating film 14. By selectively etching the second interlayer-insulating film 14 using the resist film as a mask, as shown in FIG. 2K, a source pad opening 19 for exposing the surface of the base portion 13a is formed in the second interlayer-insulating film 14.

Next, after the resist film is removed, a material film of the source electrode pad 15 is formed over the second interlayer-insulating film 14 by, for example, a sputtering method, so as to cover the source pad opening 19. Then, as shown in FIG. 2L, a source electrode pad 15 is obtained by patterning the material film. A part of the source electrode pad 15 enters the source pad opening 19 and is connected to the base portion 13a of the source field plate 13 in the source pad opening 19.

Next, as shown in FIG. 2M, a drain pad contact hole 21 extending from the back surface 2b of the substrate 2, consecutively penetrating the substrate 2, the buffer layer 3, and the first nitride semiconductor layer 4, and reaching the low resistance region 5a directly under the drain electrode 10 is formed by etching.

Next, as shown in FIG. 2N, a barrier metal film 23 is formed over the side wall of the drain pad contact hole 21 and the portion of the second nitride semiconductor layer 5 facing the drain pad contact hole 21 by, for example, a sputtering method. Subsequently, a metal plug 24 is formed by, for example, a plating method, in the drain pad contact hole 21 in which the barrier metal film 23 is formed. As a result, a drain/contact plug 22 connected to the low resistance region 5a directly under the drain electrode 10 is formed in the drain pad contact hole 21. Thereafter, a drain electrode pad 16 is formed over the back surface 2b of the substrate 2 by, for example, a sputtering method, whereby a nitride semiconductor device 1 having the structure as shown in FIG. 1 is obtained.

Figure 3:
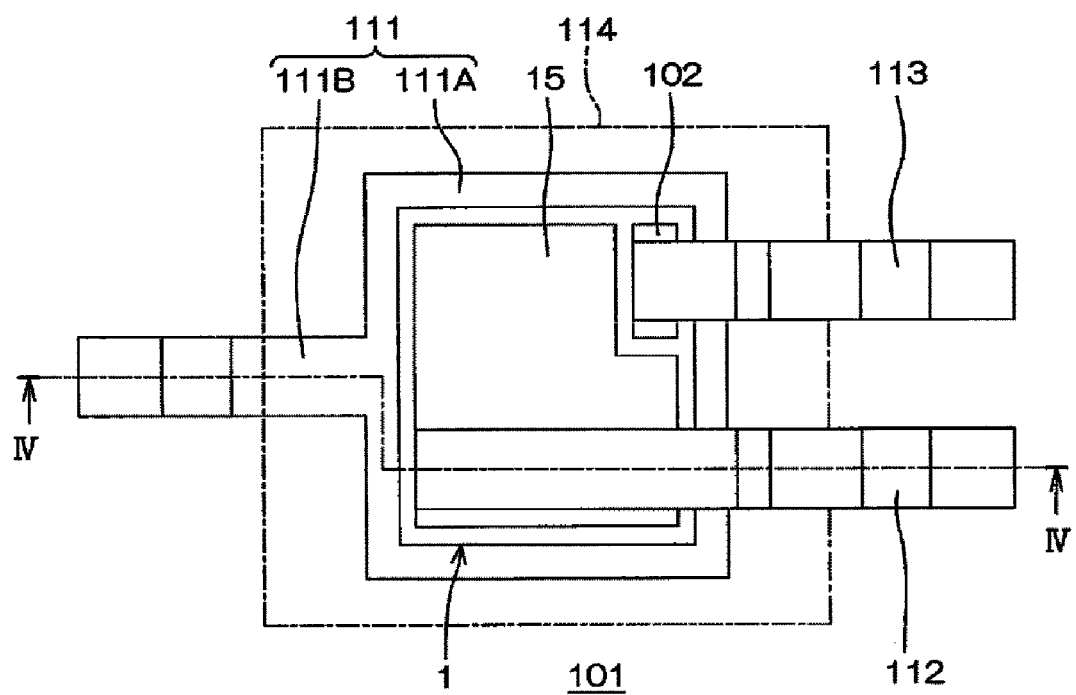
FIG. 3 is a plan view showing a package in which the above-described nitride semiconductor device is embodied.
Figure 4:
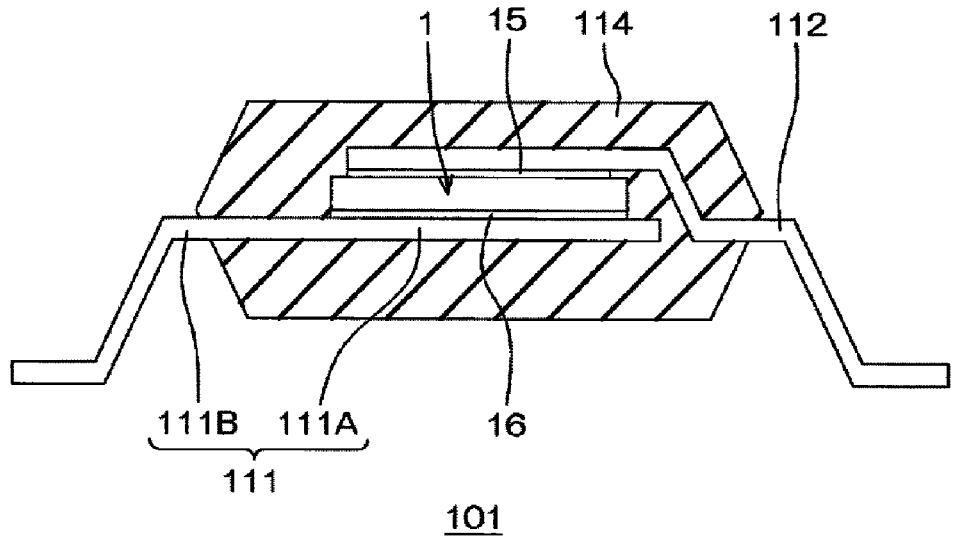
FIG. 4 is a sectional view taken along a line IV-IV in FIG. 3.

FIG. 3 is a plan view showing a package in which the above-described nitride semiconductor device 1 is embodied. FIG. 4 is a sectional view taken along a line IV-IV in FIG. 3. In FIG. 3, a mold resin is omitted.

The package 101 includes a die pad 111, a source lead 112, a gate lead 113, a nitride semiconductor device 1, and a mold resin 114 for sealing them. The die pad 111 is convex in a plan view and includes a rectangular die pad main body 111A and a drain lead 111B protruding from substantially the center of one side of the die pad main body 111A. The distal end portion of the drain lead 111B protrudes from the mold resin 114.

The nitride semiconductor device 1 is die-bonded to the surface (upper surface) of the die pad main body 111A. The nitride semiconductor device 1 includes a drain electrode pad 16 disposed over the surface facing the die pad 111. The drain electrode pad 16 is bonded to the die pad main body 111A by a conductive brazing material. The nitride semiconductor device 1 includes a source electrode pad 15 and a gate electrode pad 102 disposed over the surface opposite to the die pad 111.

The source lead 112 and the gate lead 113 are arranged in parallel with the drain lead 111B. The distal end portions of the source lead 112 and the gate lead 113 extend in a direction opposite to the protruding direction of the distal end portion of the drain lead 111B and protrude from the mold resin 114. One end portion of the source lead 112 is connected to the source electrode pad 15, and the other end portion thereof protrudes from the mold resin 114. One end portion of the gate lead 113 is connected to the gate electrode pad 102, and the other end portion thereof protrudes from the mold resin 114. The die pad 111, the source lead 112, and the gate lead 113 are formed of, for example, a copper or aluminum plate.

In the above-described first embodiment, the source electrode pad 15 is formed over one surface side of the nitride semiconductor device 1, and the drain electrode pad 16 is formed over the other surface side of the nitride semiconductor device 1. For this reason, it is possible to adopt a general vertical transistor package.

Figure 5:
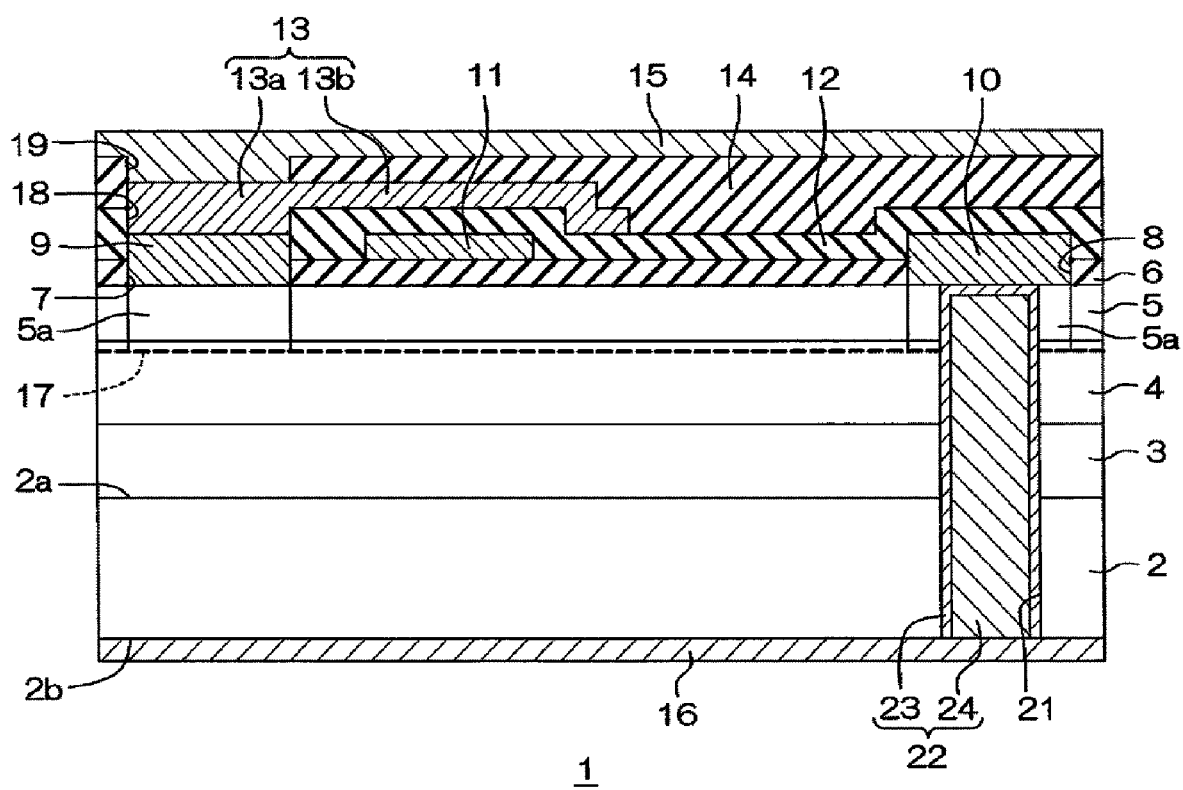
FIG. 5 is a sectional view showing a modification of the first embodiment.

In the above-described first embodiment, the drain pad contact hole 21 is formed between the back surface 2b of the substrate 2 and the second nitride semiconductor layer 5 so as to consecutively penetrate the substrate 2, the buffer layer 3, and the first nitride semiconductor layer 4. However, as shown in FIG. 5, the drain pad contact hole 21 may be formed between the back surface 2b of the substrate 2 and the drain electrode 10 so as to consecutively penetrate the substrate 2, the buffer layer 3, the first nitride semiconductor layer 4, and the second nitride semiconductor layer 5. In this case, the drain/contact plug 22 connected to the drain electrode 10 is buried in the drain pad contact hole 21. In this case, the drain electrode pad 16 is electrically connected to the drain electrode 10 via a conductive path composed of the drain/contact plug 22. The drain/contact plug 22 is composed of a barrier metal film 23 and a metal plug 24 as in the first embodiment described above.

Figure 6:
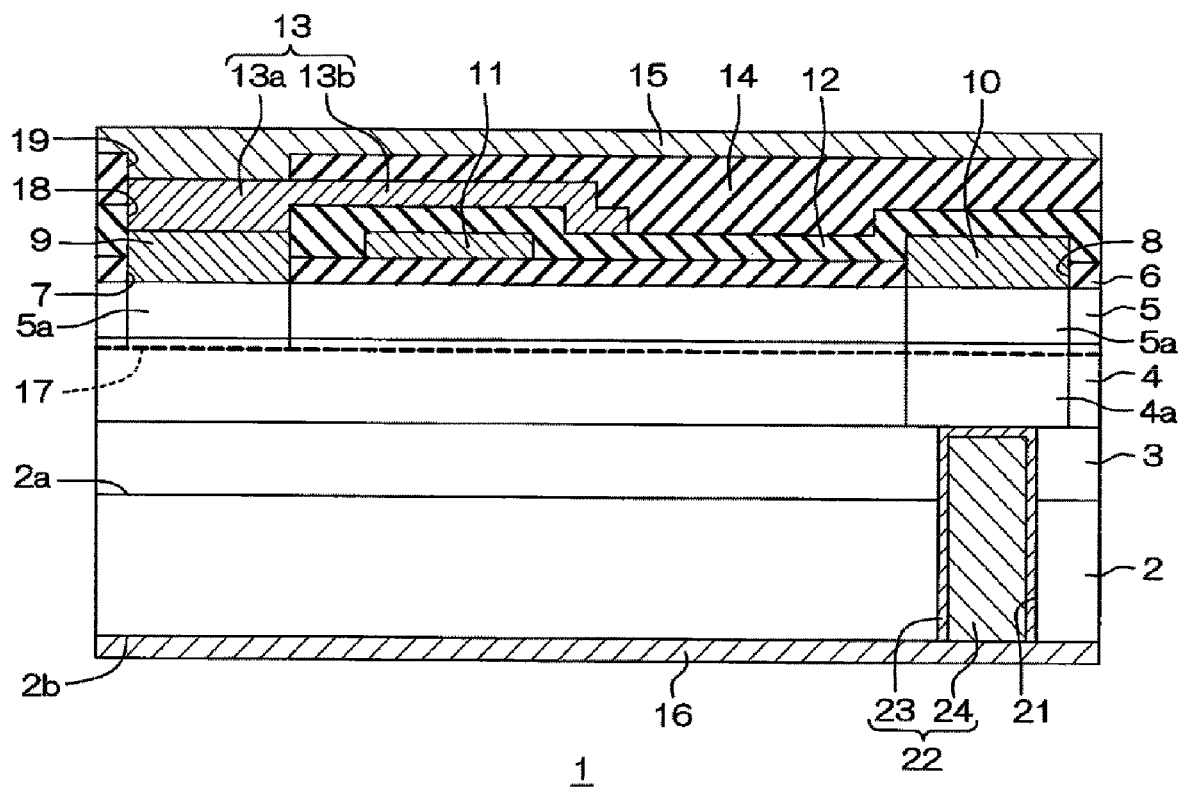
FIG. 6 is a sectional view showing another modification of the first embodiment.

As shown in FIG. 6, the drain pad contact hole 21 is formed between the back surface 2b of the substrate 2 and the first nitride semiconductor layer 4 so as to consecutively penetrate the substrate 2 and the buffer layer 3. In this case, as shown in FIG. 6, a low resistance region 4a in which an n-type impurity is diffused is preferably formed at least in the region of the first nitride semiconductor layer 4 directly under the low resistance region 5a, directly under the drain electrode 10, of the second nitride semiconductor layer 5. In this case, the drain/contact plug 22 connected to the low resistance region 4a of the first nitride semiconductor layer 4 is buried in the drain pad contact hole 21. In this case, the drain electrode pad 16 is electrically connected to the drain electrode 10 via a conductive path formed of the drain/contact plug 22, the low resistance region 4a of the first nitride semiconductor layer 4, and the low resistance region 5a, directly under the drain electrode 10, of the second nitride semiconductor layer 5.

The drain pad contact hole 21 may extend from the position on the back surface 2b of the substrate 2 facing the drain electrode 10 toward the drain electrode 10 and may consecutively penetrate at least the substrate 2 and the buffer layer 3 among the substrate 2, the buffer layer 3, the first nitride semiconductor layer 4, and the second nitride semiconductor layer 5.

Figure 7:
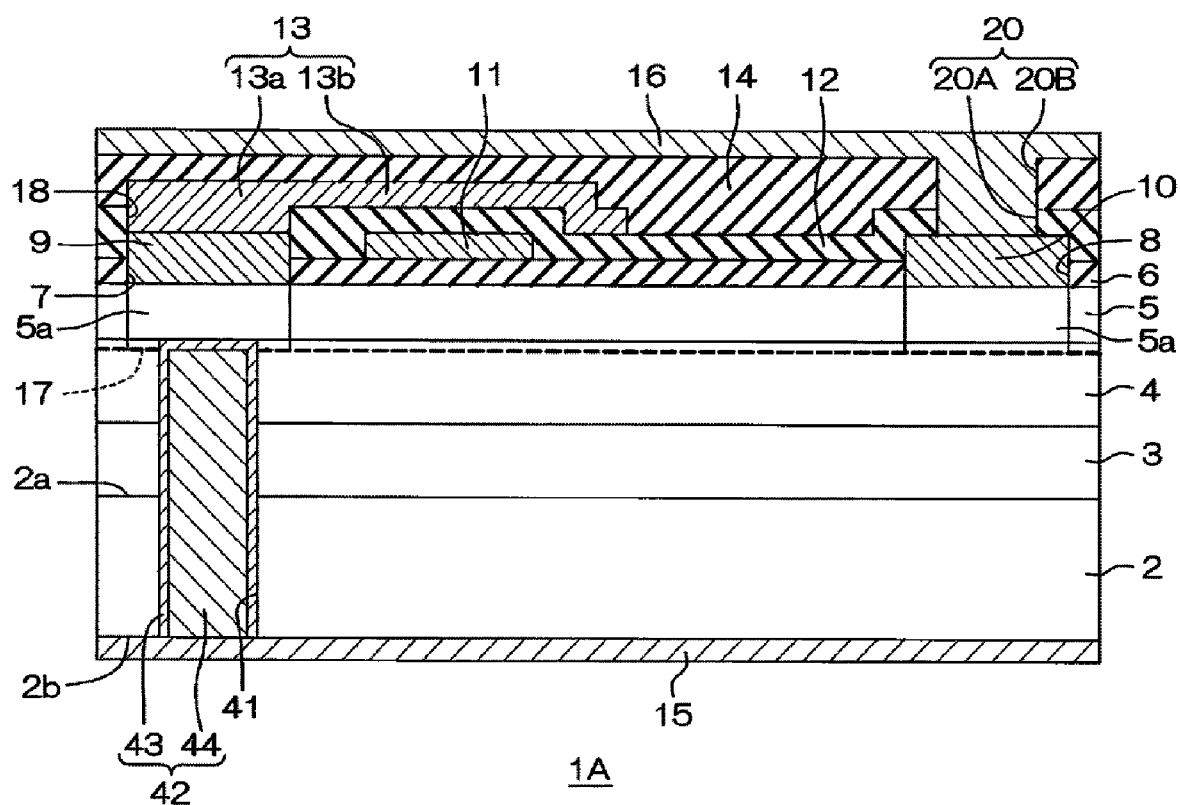
FIG. 7 is a sectional view for explaining a configuration of a nitride semiconductor device according to a second embodiment of the present disclosure.

FIG. 7 is a sectional view for explaining a configuration of a nitride semiconductor device according to a second embodiment of the present disclosure.

The nitride semiconductor device 1A includes a substrate 2, a buffer layer 3 formed over the front surface 2a of the substrate 2, a first nitride semiconductor layer 4 epitaxially grown on the buffer layer 3, and a second nitride semiconductor layer 5 epitaxially grown on the first nitride semiconductor layer 4.

The nitride semiconductor device 1A further includes a gate-insulating film 6 formed over the second nitride semiconductor layer 5. The nitride semiconductor device 1A further includes a source electrode 9 and a drain electrode 10 penetrating the source electrode contact hole 7 and the drain electrode contact hole 8 formed in the gate-insulating film 6 and making ohmic contact with the second nitride semiconductor layer 5. The source electrode 9 and the drain electrode 10 are spaced apart from each other.

The nitride semiconductor device 1A further includes a gate electrode 11 formed over the gate-insulating film 6. The gate electrode 11 is disposed between the source electrode 9 and the drain electrode 10.

The nitride semiconductor device 1A further includes a first interlayer-insulating film 12 covering the gate-insulating film 6, the gate electrode 11, and the drain electrode 10, a source field plate 13 formed over the first interlayer-insulating film 12, and a second interlayer-insulating film 14 covering the first interlayer-insulating film 12 and the source field plate 13. The nitride semiconductor device 1A further includes a drain electrode pad 16 formed over the second interlayer-insulating film 14 and a source electrode pad 15 formed over the back surface 2b of the substrate 2. In addition to the drain electrode pad 16, a gate electrode pad (not shown) is formed over the second interlayer-insulating film 14.

In the present embodiment, the substrate 2 is a low resistance silicon substrate. The low resistance silicon substrate may have an impurity concentration of, for example, $1\times10^{17}$ cm$^{-3}$ to $1\times10^{20}$ cm$^{-3}$ (more specifically, about $1\times10^{18}$ cm$^{-3}$). The thickness of the substrate 2 is about 30 µm to 300 µm.

The buffer layer 3 is a buffer layer for alleviating distortion caused by a difference between the lattice constant of the first nitride semiconductor layer 4 formed over the buffer layer 3 and the lattice constant of the substrate 2. In the present embodiment, the buffer layer 3 is composed of a multilayer buffer layer in which a plurality of nitride semiconductor films is laminated one above another. In the present embodiment, the buffer layer 3 is composed of a laminated film of an AlN film making contact with the front surface of the substrate 2 and an AlGaN film laminated on the surface (the surface opposite to the substrate 2) of the AlN film. The buffer layer 3 may be composed of an AlN film alone or an AlGaN film alone.

The first nitride semiconductor layer 4 constitutes an electron transit layer. In the embodiment, the first nitride semiconductor layer 4 is formed of an n-type GaN layer doped with a donor type impurity and has a thickness of about 1.0 µm to 10 µm. Alternatively, the first nitride semiconductor layer 4 may be composed of an undoped GaN layer.

The second nitride semiconductor layer 5 constitutes an electron supply layer. The second nitride semiconductor layer 5 is made of a nitride semiconductor having a larger band gap than the first nitride semiconductor layer 4. Specifically, the second nitride semiconductor layer 5 is made of a nitride semiconductor having a higher Al composition than the first nitride semiconductor layer 4. In the nitride semiconductor, the band gap becomes larger as the Al composition becomes higher. In the present embodiment, the second nitride semiconductor layer 5 is formed of an $Al_{x1}Ga_{1-x1}N$ layer (0<x1<1) and has a thickness of about 10 nm to 100 nm.

In this manner, the first nitride semiconductor layer 4 (electron transit layer) and the second nitride semiconductor layer 5 (electron supply layer) are made of nitride semiconductors having different band gaps (Al compositions). Lattice mismatch occurs between the first nitride semiconductor layer 4 and the second nitride semiconductor layer 5. Due to spontaneous polarization of the first nitride semiconductor layer 4 and the second nitride semiconductor layer 5 and piezo-polarization caused by lattice mismatch between the first nitride semiconductor layer 4 and the second nitride semiconductor layer 5, the energy level of the conduction band of the first nitride semiconductor layer 4 at the interface between the first nitride semiconductor layer 4 and the second nitride semiconductor layer 5 becomes lower than the Fermi level. As a result, the two-dimensional electron gas (2DEG) layer 17 expands at a position close to the interface between the first nitride semiconductor layer 4 and the second nitride semiconductor layer 5 (for example, a position spaced apart by several A from the interface).

The gate-insulating film 6 is formed over substantially the entire region of the surface of the second nitride semiconductor layer 5. In the present embodiment, the gate-insulating film 6 is made of $SiO_2$. The thickness of the gate-insulating film 6 is about 10 nm to 100 nm. The gate-insulating film 6 may be made of SiN, SiON, $Al_2O_3$, AlN, AlON, HfO, HfN, HfON, HfSiON, AlON, or the like, in addition to $SiO_2$.

The source electrode 9 and the drain electrode 10 are composed of, for example, a Ti/AlSiCu/Ti/TiN laminated film in which a Ti film, an AlSiCu film, a Ti film, and a TiN film are laminated in this order from the lower layer. The thickness of the Ti film on the lower layer side is, for example, about 50 nm. The thickness of the AlSiCu film is, for example, about 1000 nm. The thickness of the Ti film on the upper layer side is, for example, about 20 nm. The thickness of the TiN film is, for example, about 50 nm.

The gate electrode 11 is formed to make contact with the surface of the gate-insulating film 6. The gate electrode 11 is disposed so as to be biased toward the source electrode contact hole 7. The gate electrode 11 is composed of, for example, a Ti/AlSiCu/Ti/TiN laminated film in which a Ti film, an AlSiCu film, a Ti film, and a TiN film are laminated in this order from the lower layer. The thickness of the Ti film on the lower layer side is, for example, about 50 nm. The thickness of the AlSiCu film is, for example, about 1000 nm. The thickness of the Ti film on the upper layer side is, for example, about 20 nm. The thickness of the TiN film is, for example, about 50 nm.

The first interlayer-insulating film 12 covers the front surface of the gate-insulating film 6, the side surface and the front surface of the gate electrode 11, the side surface (excluding the region covered with the gate-insulating film 6) and the front surface of the source electrode 9, and the side surface (excluding the region covered with the insulating film 6) and the front surface of the drain electrode 10. In the present embodiment, the first interlayer-insulating film 12 is formed of a $SiO_2$ film and has a thickness of about 0.5 µm to 1.0 µm. In the first interlayer-insulating film 12, a field plate opening 18 for exposing the front surface of the source electrode 9 is formed at a position facing the source electrode 9. Furthermore, in the first interlayer-insulating film 12, a first drain pad opening 20A for exposing a part of the surface of the drain electrode 10 is formed at a position facing the drain electrode 10. The first interlayer-insulating film 12 may be made of SiN or the like, in addition to $SiO_2$.

A source field plate 13 covering the field plate opening 18 is formed over the first interlayer-insulating film 12. A part of the source field plate 13 enters the field plate opening 18 and is connected to the source electrode 9 within the field plate opening 18. The source field plate 13 includes a base portion 13a formed over the surface of the source electrode 9 and a plate portion 13b extending from the base portion 13a toward the drain electrode 10 through the upper side of the gate electrode 11. The plate portion 13b has a portion disposed between the gate electrode 11 and the drain electrode 10. The source field plate 13 is provided to alleviate electric field concentration on the end portion of the gate electrode 11. The source field plate 13 is formed of, for example, a TiN film, a Ti film, an Al film, or the like. The thickness of the plate portion 13b of the source field plate 13 is, for example, about 100 nm.

The second interlayer-insulating film 14 covers the first interlayer-insulating film 12 and the source field plate 13. In the present embodiment, the second interlayer-insulating film 14 is formed of a $SiO_2$ film and has a thickness of 0.5 µm to 1.0 µm. In the second interlayer-insulating film 14, there is formed a second drain pad opening 20B communicating with the first drain pad opening 20A. The drain pad opening 20 is formed by the first drain pad opening 20A and the second drain pad opening 20B.

A drain electrode pad 16 covering the drain pad opening 20 is formed over the second interlayer-insulating film 14. The drain electrode pad 16 is formed over substantially the entire region on the second interlayer-insulating film 14. A part of the drain electrode pad 16 enters the drain pad opening 20 and is connected to the drain electrode 10 within the drain pad opening 20. The drain electrode pad 16 is formed of, for example, an Al film, an AlCu film, or the like.

On the second interlayer-insulating film 14, there is a removal region where the drain electrode pad 16 is not formed. A gate electrode pad (not shown) is formed in this removal region. The gate electrode pad is electrically connected to the gate electrode 11 via a gate wiring (not shown).

In the second nitride semiconductor layer 5, a low resistance region 5a in which Al is diffused is formed in a region directly under the source electrode 9 and a region directly under the drain electrode 10. In the present embodiment, the low resistance region 5a also extends to the surface layer portion of the first nitride semiconductor layer 4.

Between the back surface 2b of the substrate 2 and the second nitride semiconductor layer 5, there is formed a source pad contact hole 41 extending from the position facing the source electrode 9 on the back surface 2b of the substrate 2 toward the source electrode 9 and consecutively penetrating the substrate 2, the buffer layer 3, and the first nitride semiconductor layer 4. In the present embodiment, the upper end of the source pad contact hole 41 reaches the low resistance region 5a in the second nitride semiconductor layer 5 that is directly under the source electrode 9.

A source/contact plug (conductor) 42 having its upper end connected to the low resistance region 5a in the second nitride semiconductor layer 5 directly under the source electrode 9 is buried in the source pad contact hole 41. The source/contact plug 42 includes a barrier metal film 43 formed over the sidewall of the source pad contact hole 41 and the portion of the second nitride semiconductor layer 5 facing the source pad contact hole 41, and a metal plug 44 buried in the source pad contact hole 41 in a state surrounded by the barrier metal film 43. The barrier metal film 43 is made of, for example, TiN. The metal plug 44 is made of, for example, Cu.

The source electrode pad 15 is formed over substantially the entire region of the back surface 2b of the substrate 2. The source electrode pad 15 is connected to the lower end of the source/contact plug 42. Therefore, the source electrode pad 15 is electrically connected to the source electrode 9 via a conductive path composed of the source/contact plug 42 and the low resistance region 5a in the second nitride semiconductor layer 5 directly under the source electrode 9. The source electrode pad 15 is made of, for example, Ni, Ag, Au, Ti, or the like.

In the nitride semiconductor device 1, a second nitride semiconductor layer 5 (electron supply layer) having a different band gap (Al composition) is formed over the first nitride semiconductor layer 4 (electron transit layer) to form a hetero-junction. Thus, a two-dimensional electron gas layer 17 is formed in the first nitride semiconductor layer 4 in the vicinity of the interface between the first nitride semiconductor layer 4 and the second nitride semiconductor layer 5. A HEMT using the two-dimensional electron gas layer 17 as a channel is formed. In a state where a control voltage is not applied to the gate electrode 11, the source electrode 9 and the drain electrode 10 are connected to each other with the two-dimensional electron gas layer 17 used as a channel. Therefore, the HEMT is of a normally turned-on type. When a control voltage for causing the potential of the gate electrode 11 to become negative with respect to the source electrode 9 is applied to the gate electrode 11, the two-dimensional electron gas layer 17 is cut off and the HEMT is turned off.

Figure 8A:
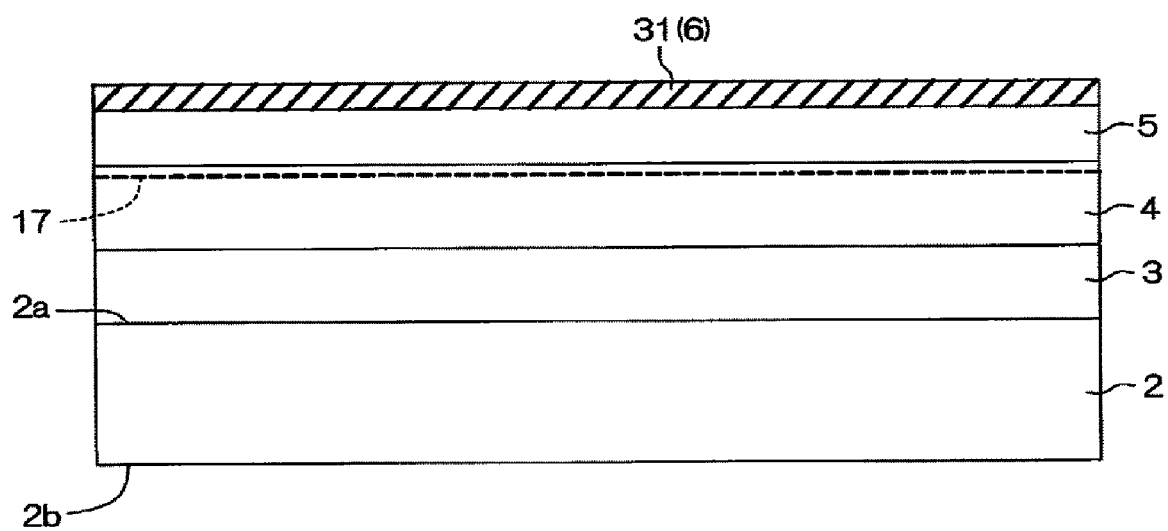
FIG. 8A is a sectional view showing an example of a manufacturing process of a nitride semiconductor device.
Figure 8B:
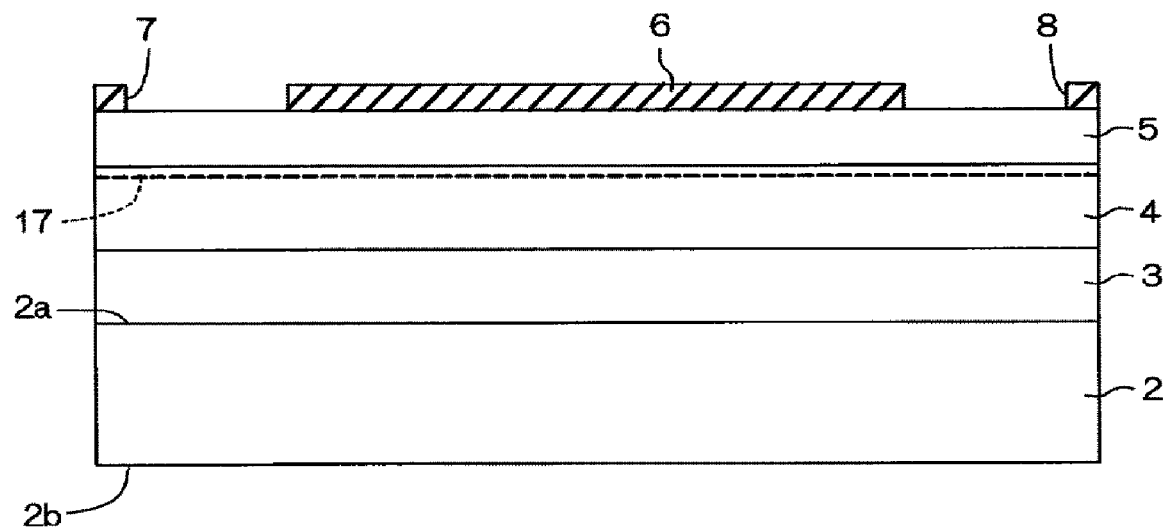
FIG. 8B is a sectional view showing a next step of FIG. 8A.
Figure 8C:
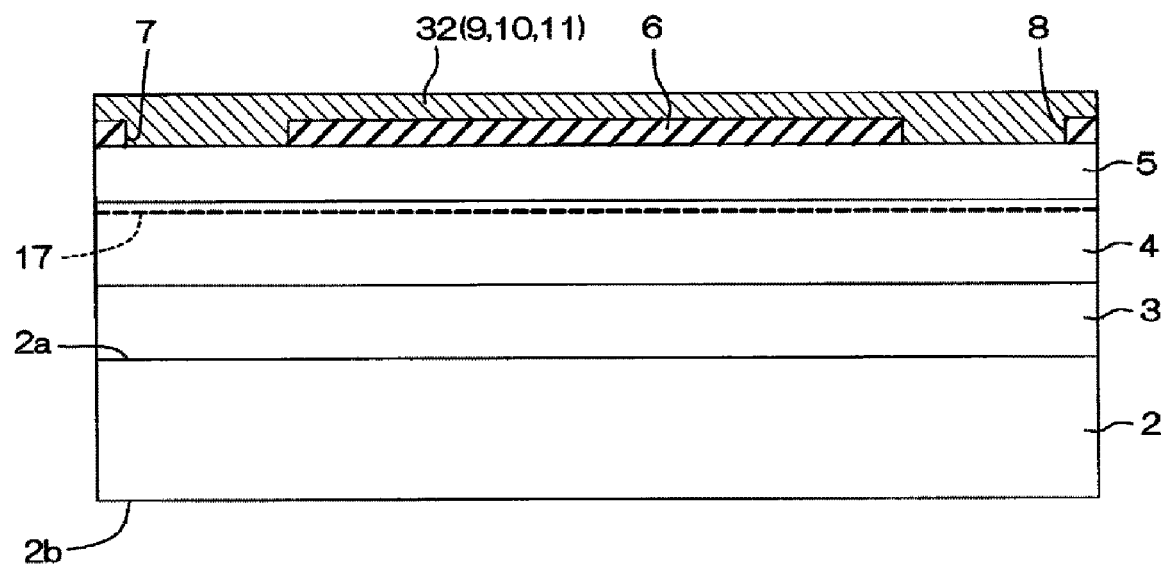
FIG. 8C is a sectional view showing a next step of FIG. 8B.
Figure 8D:
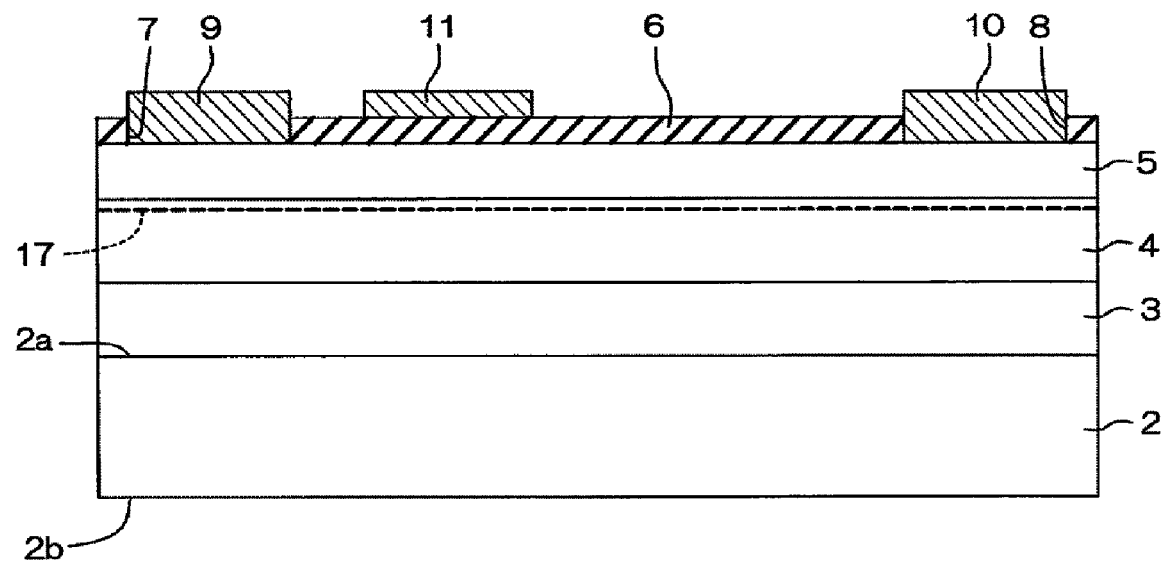
FIG. 8D is a sectional view showing a next step of FIG. 8C.
Figure 8E:
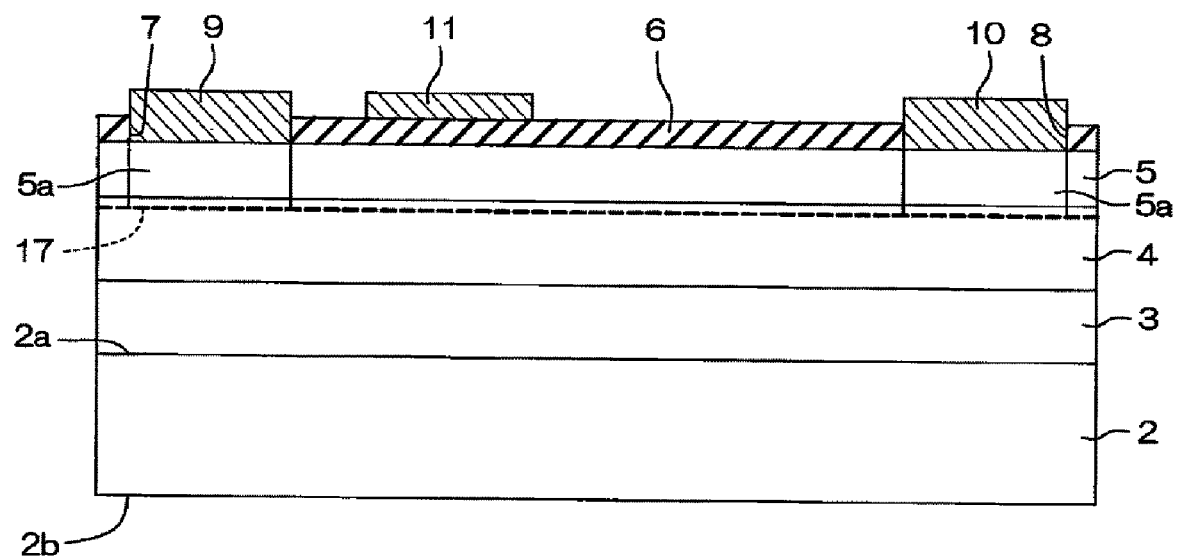
FIG. 8E is a sectional view showing a next step of FIG. 8D.
Figure 8F:
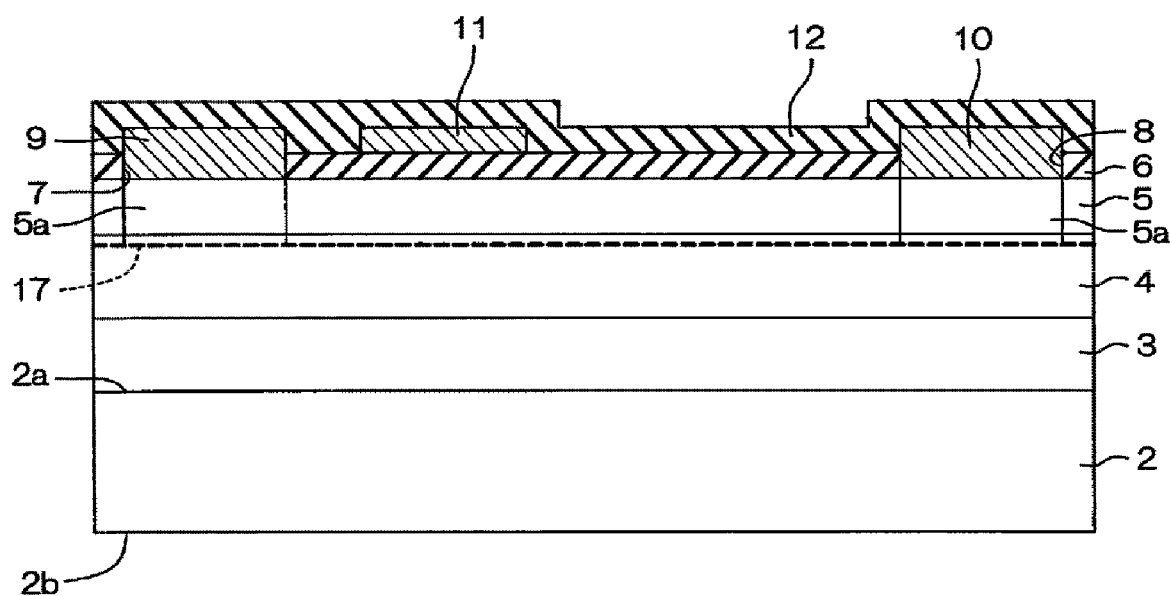
FIG. 8F is a sectional view showing a next step of FIG. 8E.
Figure 8G:
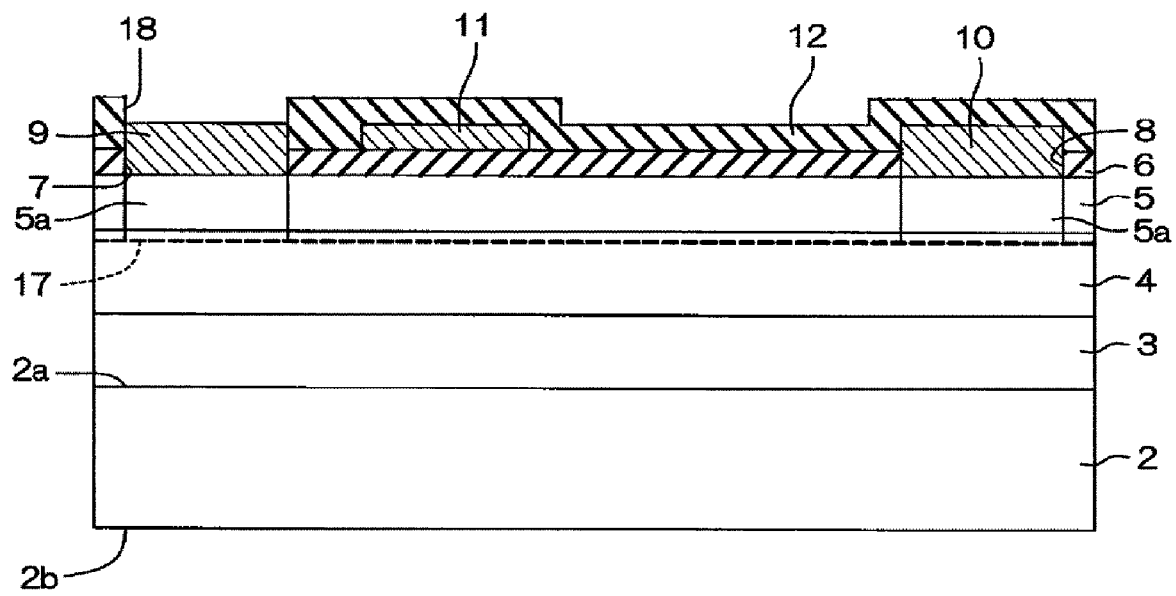
FIG. 8G is a sectional view showing a next step of FIG. 8F.
Figure 8H:
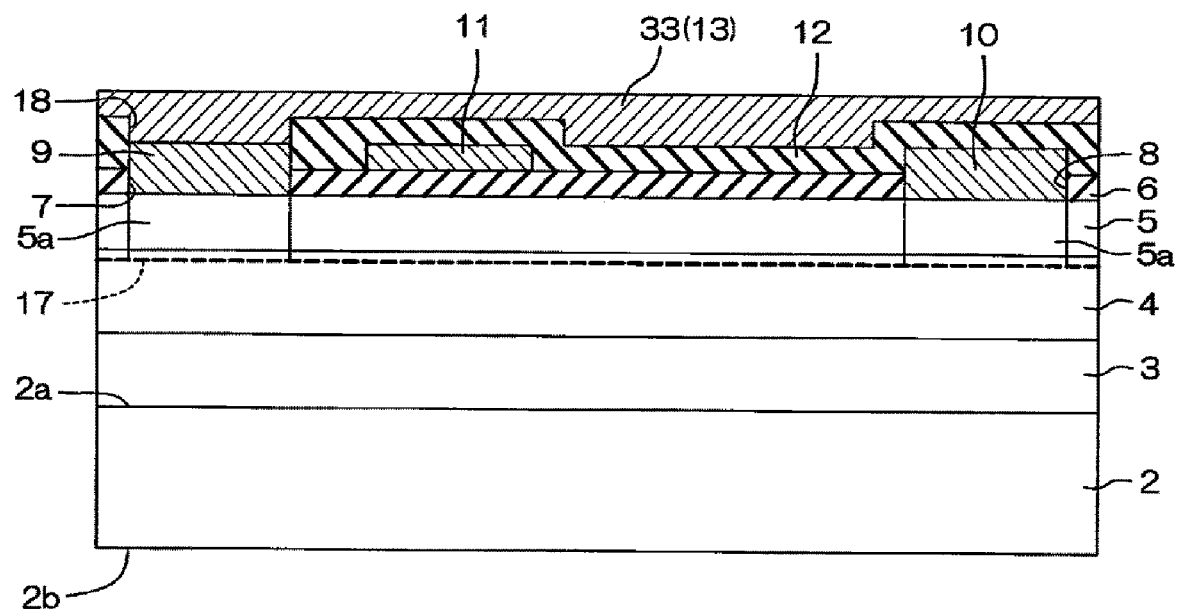
FIG. 8H is a sectional view showing a next step of FIG. 8G.
Figure 8I:
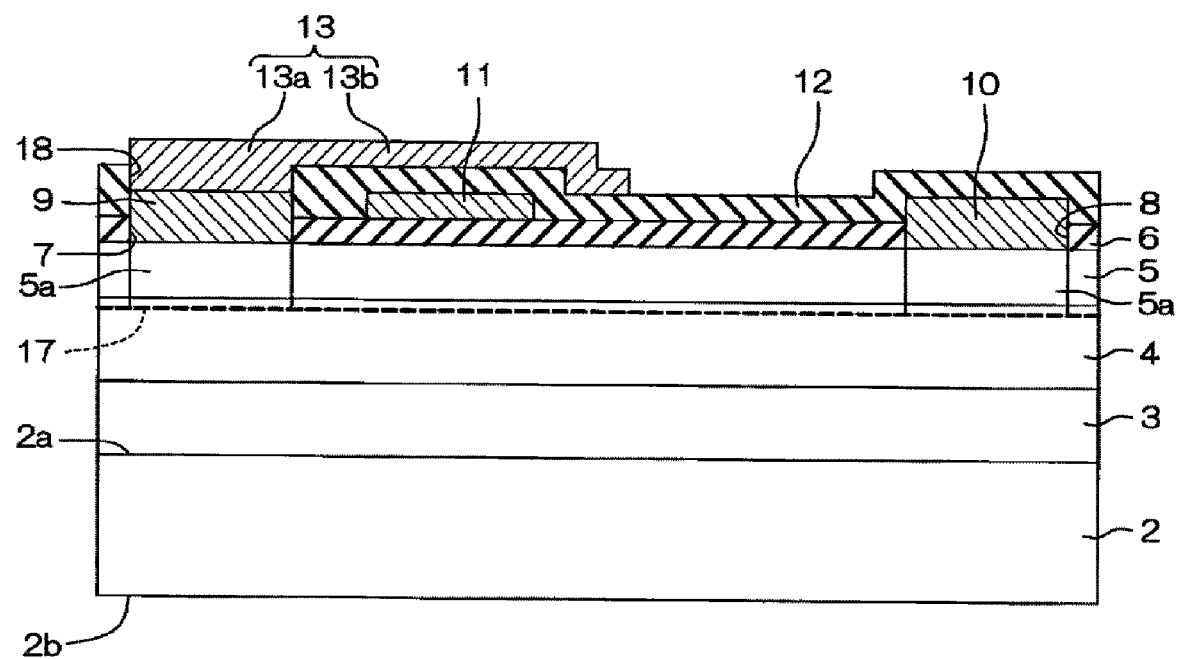
FIG. 8I is a sectional view showing a next step of FIG. 8H.
Figure 8J:
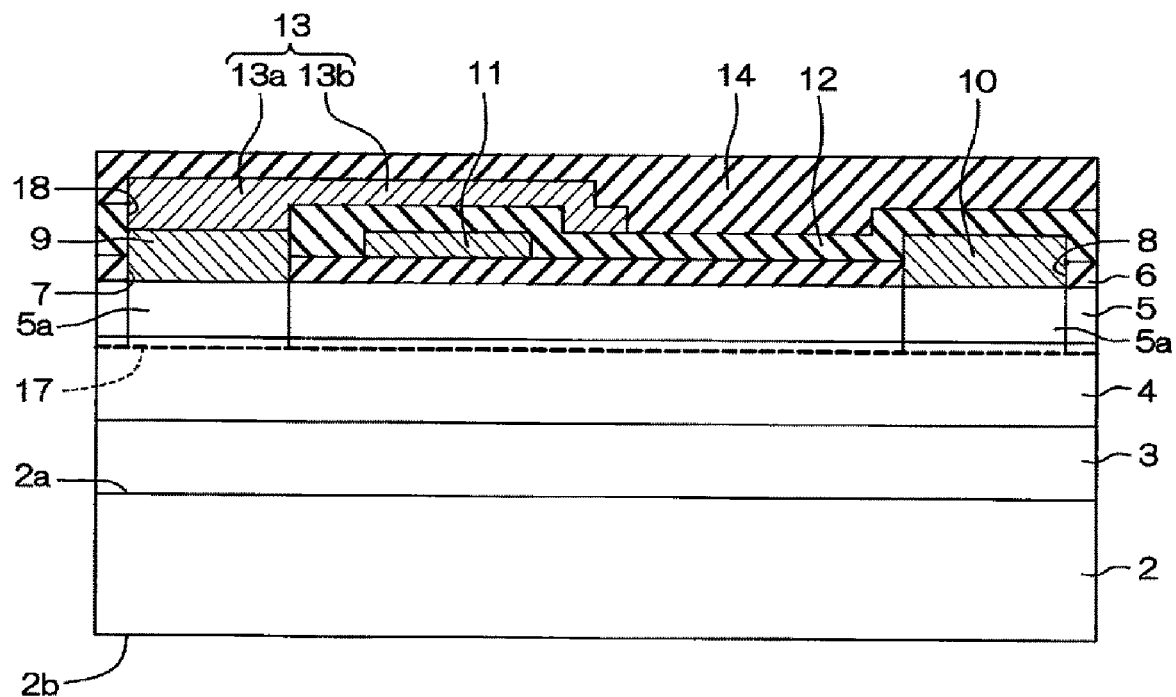
FIG. 8J is a sectional view showing a next step of FIG. 8I.
Figure 8K:
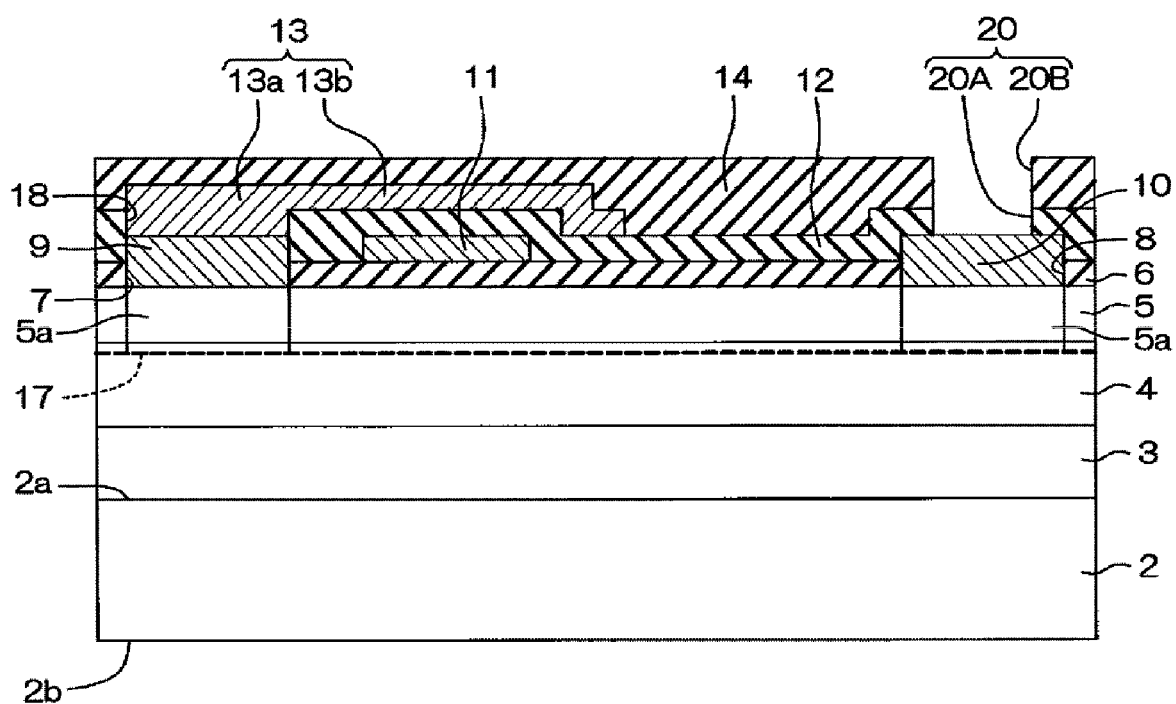
FIG. 8K is a sectional view showing a next step of FIG. 8J.
Figure 8L:
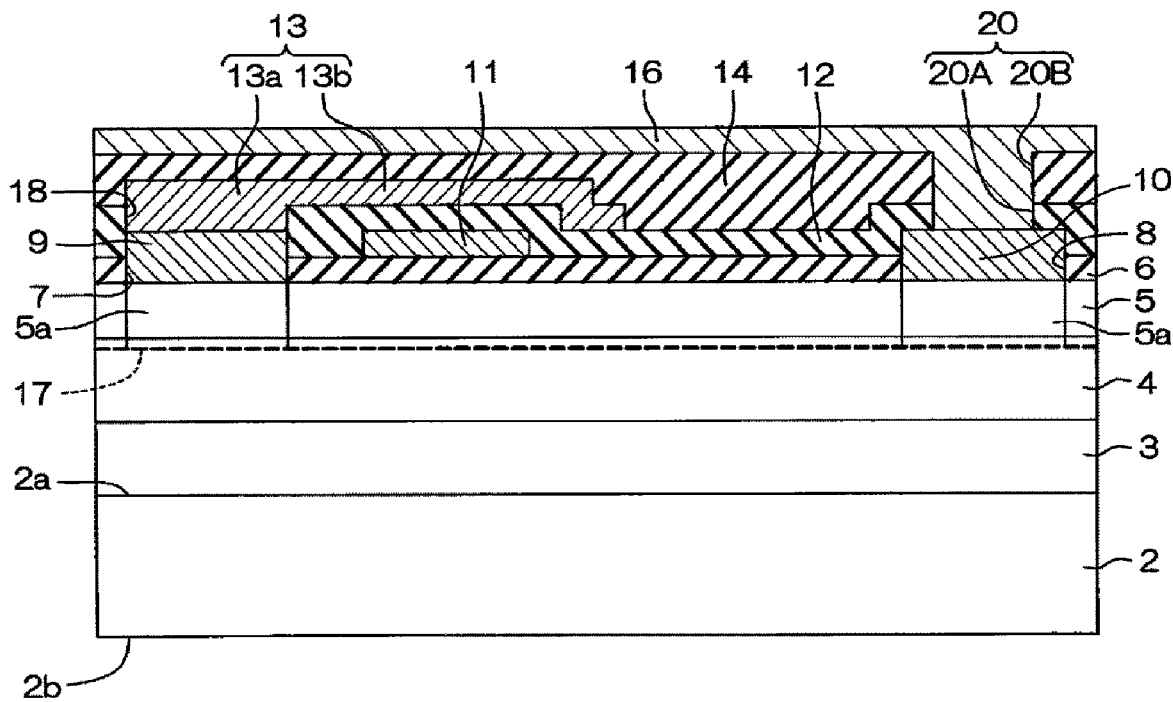
FIG. 8L is a sectional view showing a next step of FIG. 8K.
Figure 8M:
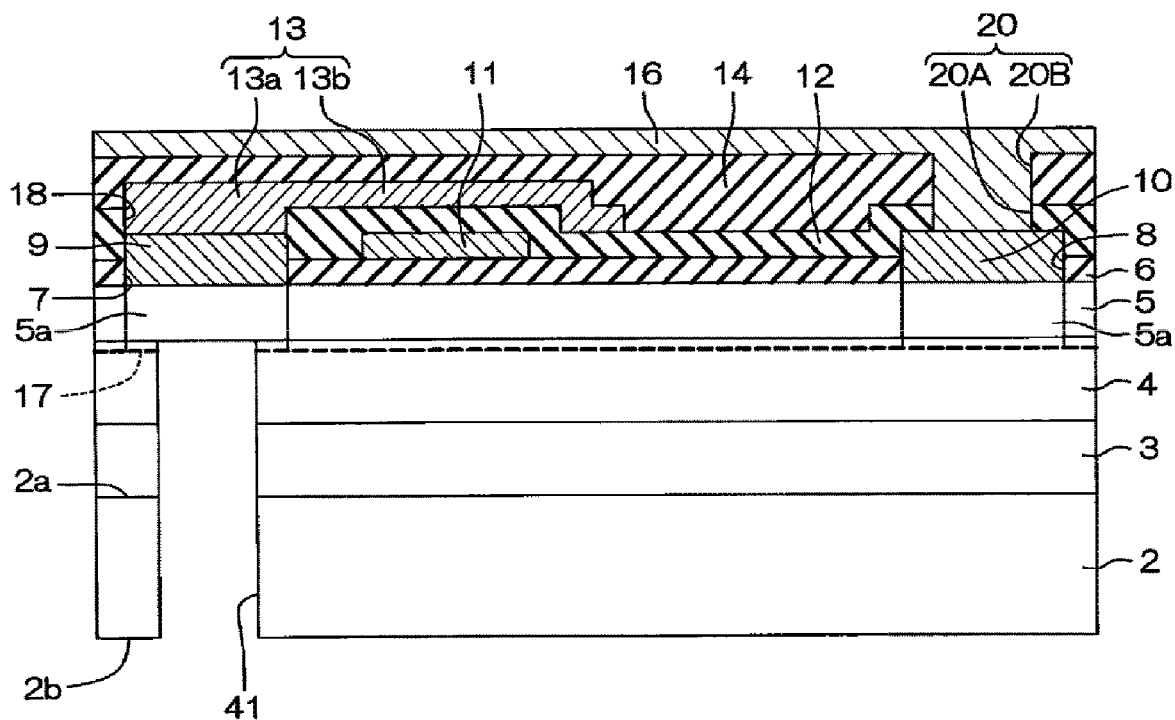
FIG. 8M is a sectional view showing a next step of FIG. 8L.
Figure 8N:
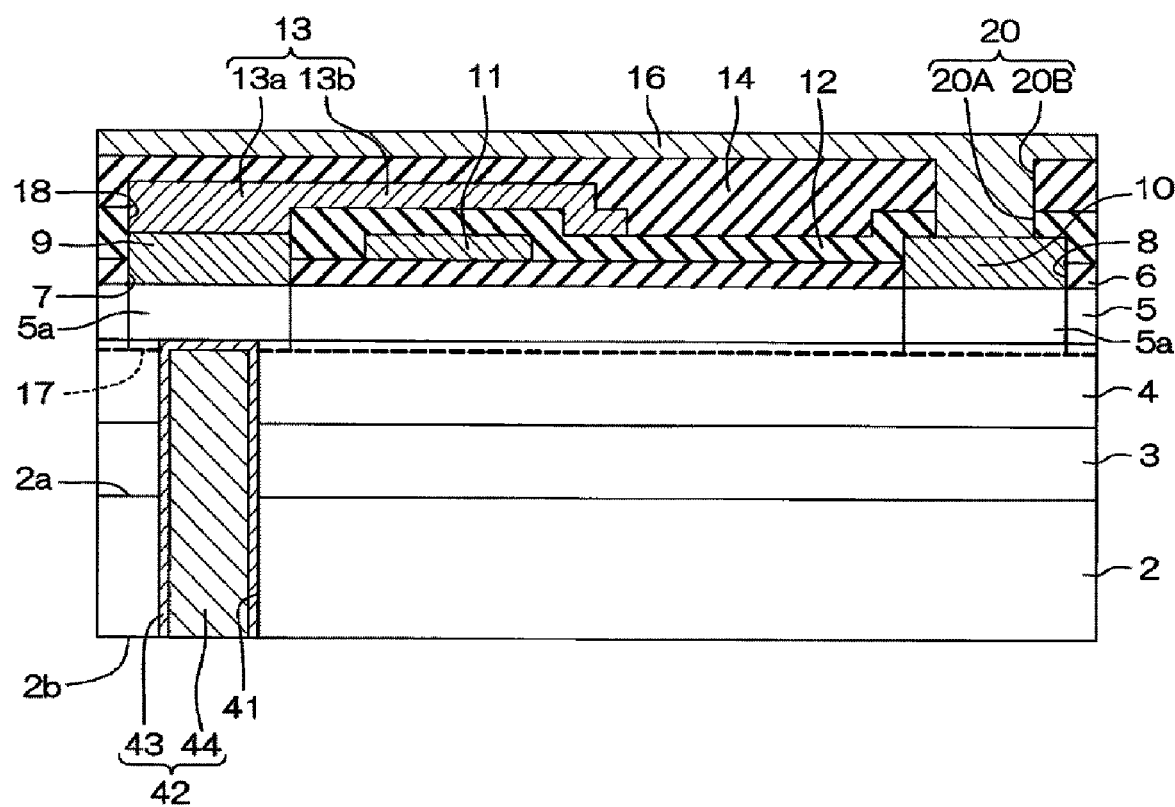
FIG. 8N is a sectional view showing a next step of FIG. 8M.

FIGS. 8A to 8N are sectional views for explaining an example of a manufacturing process of the above-described nitride semiconductor device 1A and show sectional structures in a plurality of steps in the manufacturing process.

First, as shown in FIG. 8A, a buffer layer 3 and a first nitride semiconductor layer (electron transit layer) 4 are sequentially epitaxially grown on a front surface 2a of a substrate 2 by an MOCVD (Metal Organic Chemical Vapor Deposition) method. Further, a second nitride semiconductor layer (electron supply layer) 5 is epitaxially grown on the first nitride semiconductor layer 4 by a MOCVD method. Moreover, an insulating material film 31 as a material film for a gate-insulating film 6 is formed in the second nitride semiconductor layer 5 by a plasma CVD method, an LPCVD (Low Pressure CVD) method, an ALD (Atomic Layer Deposition) method, or the like.

Next, on the insulating material film 31, a resist film is formed in a region excluding the region where a source electrode contact hole 7 and a drain electrode contact hole 8 are to be formed. By etching the insulating material film 31 via the resist film, as shown in FIG. 8B, the source electrode contact hole 7 and the drain electrode contact hole 8 are formed. Thus, the insulating material film 31 is patterned to obtain a gate-insulating film 6. The source electrode contact hole 7 and the drain electrode contact hole 8 penetrate the gate-insulating film 6 and reach the second nitride semiconductor layer 5.

Next, after the resist film is removed, as shown in FIG. 8C, an electrode film 32 which is a material film for a source electrode 9, a drain electrode 10, and a gate electrode 11 is formed over the second nitride semiconductor layer 5 by, for example, a vapor deposition method, a sputtering method, or the like so as to cover the gate-insulating film 6. The electrode film 32 is composed of, for example, a Ti/AlSiCu/ Ti/TiN laminated film in which a Ti film, an AlSiCu film, a Ti film, and a TiN film are laminated in this order from the lower layer.

Next, a resist film covering a region where the source electrode is to be formed, a region where the drain electrode is to be formed, and a region where the gate electrode is to be formed on the surface of the electrode film 32 is formed. Then, the electrode film 32 is selectively etched using the resist film as a mask, whereby the source electrode 9, the drain electrode 10, and the gate electrode 11 are obtained as shown in FIG. 8D.

Next, as shown in FIG. 8E, an annealing process is performed after removing the resist film, whereby the source electrode 9 and the drain electrode 10 make ohmic contact with the two-dimensional electron gas layer 17 via the second nitride semiconductor layer 5. At this time, Al contained in the source electrode 9 and the drain electrode 10 is diffused into the second nitride semiconductor layer 5. Thus, a low resistance region 5a is formed in a region directly under the source electrode 9 and a region directly under the drain electrode 10, in the second nitride semiconductor layer 5.

Next, as shown in FIG. 8F, a first interlayer-insulating film 12 is formed over the second nitride semiconductor layer 5 by a plasma CVD method or an LPCVD method so as to cover the source electrode 9, the drain electrode 10, and the gate electrode 11.

Next, a resist film covering a region other than the region facing the source electrode 9 on the surface of the first interlayer-insulating film 12 is formed. Then, the first interlayer-insulating film 12 is selectively etched using the resist film as a mask, whereby a field plate opening 18 for exposing the surface of the source electrode 9 is formed in the first interlayer-insulating film 12 as shown in FIG. 8G.

Next, after the resist film is removed, as shown in FIG. 8H, a plate film 33 as the material film of the source field plate 13 is formed over the first interlayer-insulating film 12 by, for example, a sputtering method, so as to cover the field plate opening 18. The plate film 33 is formed of, for example, a TiN film.

Next, a resist film is formed to cover the region where the source field plate is to be formed on the surface of the plate film 33. By selectively etching the plate film 33 using the resist film as a mask, it is possible to obtain a source field plate 13 including a base portion 13a formed over the source electrode 9 and a plate portion 13b extending from the base portion 13a toward the drain electrode 10 as shown in FIG. 8I.

Next, after the resist film is removed, as shown in FIG. 8J, a second interlayer-insulating film 14 is formed over the first interlayer-insulating film 12 by a plasma CVD method or an LPCVD method so as to cover the source field plate 13.

Next, a resist film covering a region other than the region facing a part of the surface of the drain electrode 10 on the surface of the second interlayer-insulating film 14 is formed. Then, the second interlayer-insulating film 14 and the first interlayer-insulating film 12 are selectively etched using the resist film as a mask, whereby a drain pad opening 20 for exposing a part of the surface of the drain electrode 10 is formed in the second interlayer-insulating film 14 and the first interlayer-insulating film 12 as shown in FIG. 8K. The drain pad opening 20 includes a first drain pad opening 20A penetrating the first interlayer-insulating film 12 and a second drain pad opening 20B penetrating the second interlayer-insulating film 14 and communicating with the first drain pad opening 20A.

Next, after the resist film is removed, a material film of the drain electrode pad 16 is formed over the second interlayer-insulating film 14 by, for example, a sputtering method, so as to cover the drain pad opening 20. Then, as shown in FIG. 8L, the material film is patterned to obtain a drain electrode pad 16. A part of the drain electrode pad 16 enters the drain pad opening 20 and is connected to the drain electrode 10 within the drain pad opening 20.

Next, as shown in FIG. 8M, a source pad contact hole 41 extending from the back surface 2b of the substrate 2, consecutively penetrating the substrate 2, the buffer layer 3, and the first nitride semiconductor layer 4, and reaching the low resistance region 5a directly under the source electrode 9 is formed by etching.

Next, as shown in FIG. 8N, a barrier metal film 23 is formed over the side wall of the source pad contact hole 41 and the portion of the second nitride semiconductor layer 5 facing the source pad contact hole 41 by, for example, a sputtering method. Subsequently, a metal plug 44 is formed by, for example, a plating method, in the source pad contact hole 41 in which the barrier metal film 43 is formed. As a result, a source/contact plug 42 connected to the low resistance region 5a directly under the source electrode 9 is formed in the source pad contact hole 41. Thereafter, a source electrode pad 15 is formed over the back surface 2b of the substrate 2 by, for example, a sputtering method, whereby a nitride semiconductor device 1A having the structure as shown in FIG. 7 is obtained.

In the above-described second embodiment, the drain electrode pad 16 is formed over one surface side of the nitride semiconductor device 1A, and the source electrode pad 15 is formed over the other surface side of the nitride semiconductor device 1A. For this reason, it is possible to adopt a general vertical transistor package.

Figure 9:
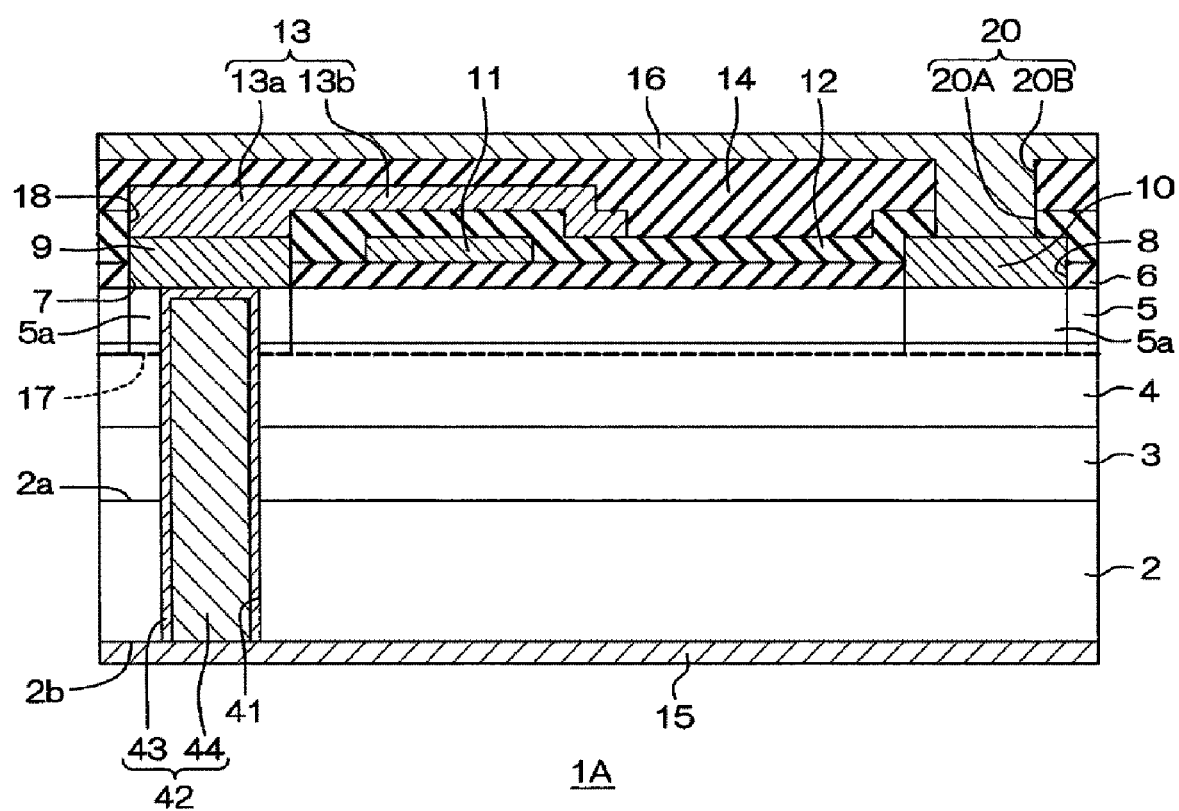
FIG. 9 is a sectional view showing a modification of the second embodiment.

In the above-described second embodiment, the source pad contact hole 41 is formed between the back surface 2b of the substrate 2 and the second nitride semiconductor layer 5 so as to consecutively penetrate the substrate 2, the buffer layer 3, and the first nitride semiconductor layer 4. However, as shown in FIG. 9, the source pad contact hole 41 may be formed between the back surface 2b of the substrate 2 and the source electrode 9 so as to consecutively penetrate the substrate 2, the buffer layer 3, the first nitride semiconductor layer 4, and the second nitride semiconductor layer 5. In this case, the source/contact plug 42 connected to the source electrode 9 is buried in the source pad contact hole 41. In this case, the source electrode pad 15 is electrically connected to the source electrode 9 via a conductive path composed of the source/contact plug 42. The source/contact plug 42 is composed of a barrier metal film 23 and a metal plug 24 as in the second embodiment described above.

Figure 10:
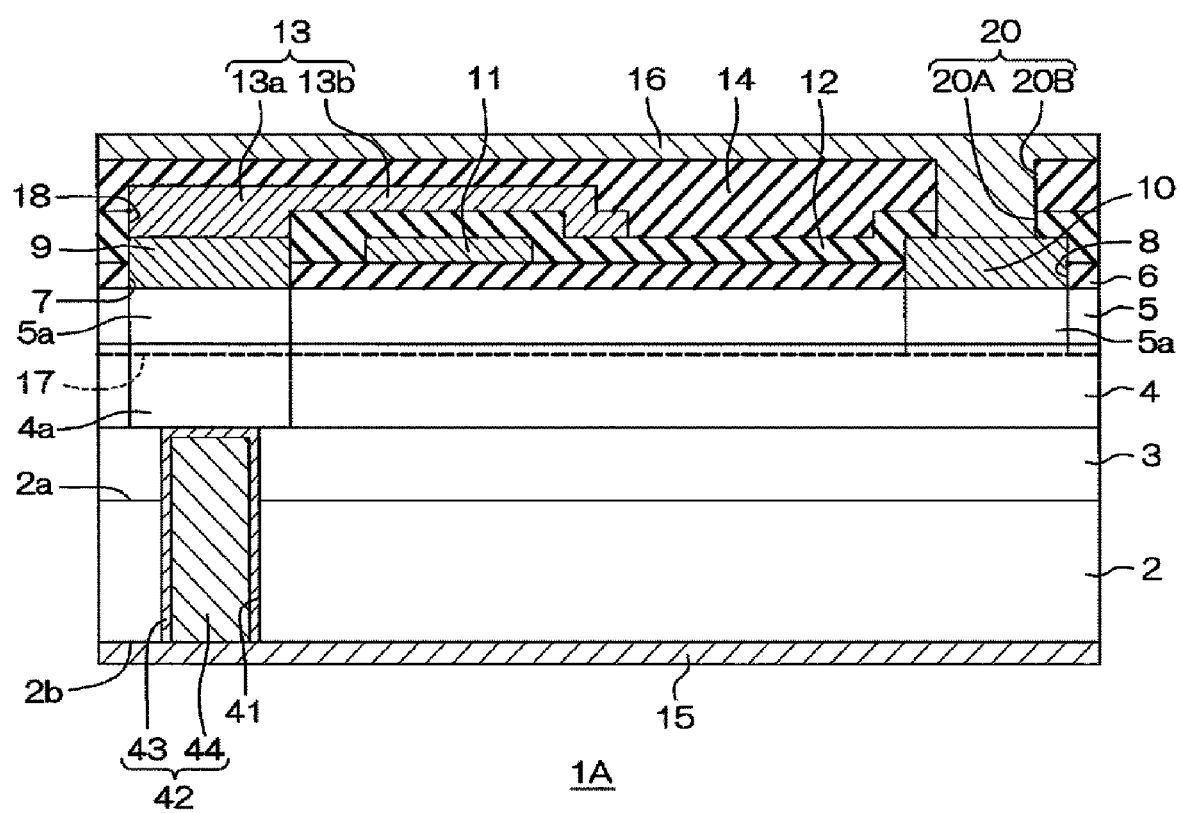
FIG. 10 is a sectional view showing another modification of the second embodiment.

As shown in FIG. 10, the source pad contact hole 41 is formed between the back surface 2b of the substrate 2 and the first nitride semiconductor layer 4 so as to consecutively penetrate the substrate 2 and the buffer layer 3. In this case, as shown in FIG. 10, a low resistance region 4a in which an n-type impurity is diffused is preferably formed at least in the region of the first nitride semiconductor layer 4 directly under the low resistance region 5a, directly under the source electrode 9, of the second nitride semiconductor layer 5. In this case, the source/contact plug 42 connected to the low resistance region 4a of the first nitride semiconductor layer 4 is buried in the source pad contact hole 41. In this case, the source electrode pad 15 is electrically connected to the source electrode 9 via a conductive path formed of the source/contact plug 42, the low resistance region 4a of the first nitride semiconductor layer 4, and the low resistance region 5a of the second nitride semiconductor layer 5 that is directly under the source electrode 9.

The source pad contact hole 41 may extend from the position on the back surface 2b of the substrate 2 facing the source electrode 9 toward the source electrode 9 and may consecutively penetrate at least the substrate 2 and the buffer layer 3 among the substrate 2, the buffer layer 3, the first nitride semiconductor layer 4, and the second nitride semiconductor layer 5.

Figure 11:
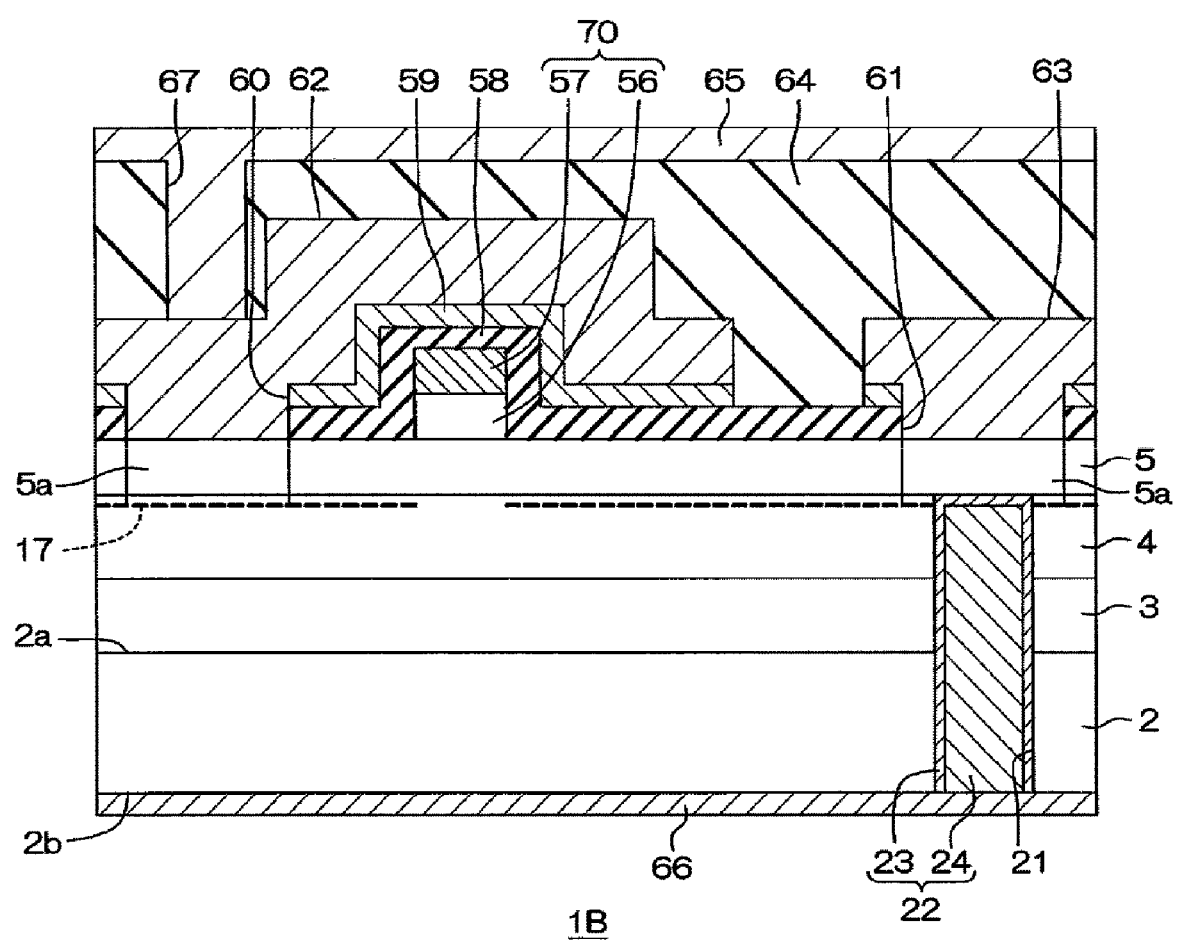
FIG. 11 is a sectional view for explaining a configuration of a nitride semiconductor device according to a third embodiment of the present disclosure.

FIG. 11 is a schematic sectional view for explaining a configuration of a nitride semiconductor device according to a third embodiment of the present disclosure.

The nitride semiconductor device 1B includes a substrate 2, a buffer layer 3 formed over the front surface 2a of the substrate 2, a first nitride semiconductor layer 4 epitaxially grown on the buffer layer 3, and a second nitride semiconductor layer 5 epitaxially grown on the first nitride semiconductor layer 4. The nitride semiconductor device 1B further includes a gate portion 70 formed over the second nitride semiconductor layer 5.

The nitride semiconductor device 1B further includes a passivation film 58 covering the second nitride semiconductor layer 5 and the gate portion 70, and a barrier metal film 59 laminated on the passivation film 58. The nitride semiconductor device 1B further includes a source electrode 62 and a drain electrode 63 penetrating the source electrode contact hole 60 and the drain electrode contact hole 61 formed in the laminated film of the passivation film 58 and the barrier metal film 59 and making ohmic contact with the second nitride semiconductor layer 5. The source electrode 62 and the drain electrode 63 are spaced apart from each other. The source electrode 62 is formed so as to cover the gate portion 70.

The nitride semiconductor device 1B further includes an interlayer-insulating film 64 that covers the source electrode 62 and the drain electrode 63. The nitride semiconductor device 1B further includes a source electrode pad 65 formed over the interlayer-insulating film 64 and a drain electrode pad 66 formed over the back surface 2b of the substrate 2. In addition to the source electrode pad 65, a gate electrode pad (not shown) is formed over the interlayer-insulating film 64.

The substrate 2 is formed of a silicon (Si) substrate. In the present embodiment, the substrate 2 is formed of a low resistance silicon substrate. The low resistance silicon substrate may have an impurity concentration of, for example, $1 \times 10^{17}$ cm$^{-3}$ to $1 \times 10^{20}$ cm$^{-3}$ (more specifically, about $1 \times 10^{18}$ cm$^{-3}$). The thickness of the substrate 2 is about 30 µm to 300 µm.

In the present embodiment, the buffer layer 3 is composed of a laminated film of an AlN film making contact with the front surface 2a of the substrate 2 and an AlGaN film laminated on the front surface (the surface opposite to the substrate 2) of the AlN film. The buffer layer 3 may be composed of an AlN film alone or an AlGaN alone.

The first nitride semiconductor layer 4 constitutes an electron transit layer. In the present embodiment, the first nitride semiconductor layer 4 is formed of a GaN layer doped with an acceptor type impurity, and the thickness thereof is about 1.0 µm to 10 µm. The concentration of the acceptor type impurity is preferably $4 \times 10^{16}$ cm$^{-3}$ or more. In the present embodiment, the acceptor type impurity is C (carbon).

The second nitride semiconductor layer 5 constitutes an electron supply layer. The second nitride semiconductor layer 5 is made of a nitride semiconductor having a larger band gap than the first nitride semiconductor layer 4. Specifically, the second nitride semiconductor layer 5 is made of a nitride semiconductor having a higher Al composition than the first nitride semiconductor layer 4. In the nitride semiconductor, the band gap becomes larger as the Al composition becomes higher. In the present embodiment, the second nitride semiconductor layer 5 is formed of an $Al_{x1}Ga_{1-x1}N$ layer (0<x1<1) and has a thickness of about 10 nm to 100 nm.

In this manner, the first nitride semiconductor layer 4 (electron transit layer) and the second nitride semiconductor layer 5 (electron supply layer) are made of nitride semiconductors having different band gaps (Al compositions). Lattice mismatch occurs between the first nitride semiconductor layer 4 and the second nitride semiconductor layer 5. Due to spontaneous polarization of the first nitride semiconductor layer 4 and the second nitride semiconductor layer 5 and piezo-polarization caused by the lattice mismatch between the first nitride semiconductor layer 4 and the second nitride semiconductor layer 5, the energy level of the conduction band of the first nitride semiconductor layer 4 at the interface between the first nitride semiconductor layer 4 and the second nitride semiconductor layer 5 becomes lower than the Fermi level. As a result, the two-dimensional electron gas (2DEG) layer 17 expands at a position close to the interface between the first nitride semiconductor layer 4 and the second nitride semiconductor layer 5 (for example, a position spaced apart by several A from the interface).

The gate portion 70 includes a nitride semiconductor gate layer 56 epitaxially grown on the second nitride semiconductor layer 5 and a gate electrode 57 formed over the nitride semiconductor gate layer 56. The gate portion 70 is arranged so as to be biased toward the source electrode contact hole 60.

The nitride semiconductor gate layer 56 is made of a nitride semiconductor doped with an acceptor type impurity. In the present embodiment, the nitride semiconductor gate layer 56 is formed of a GaN layer (p-type GaN layer) doped with an acceptor type impurity, and the thickness thereof is about 10 nm to 100 nm. The concentration of the acceptor type impurity implanted into the nitride semiconductor gate layer 56 is preferably $3 \times 10^{17}$ cm$^{-3}$ or more. In the present embodiment, the acceptor type impurity is Mg (magnesium). The acceptor type impurity may be an acceptor type impurity other than Mg, such as C (carbon) or the like. The nitride semiconductor gate layer 56 is provided for canceling the two-dimensional electron gas layer 17 generated at the interface between the first nitride semiconductor layer 4 (electron transit layer) and the second nitride semiconductor layer 5 (electron supply layer) in the region directly under the gate portion 70.

The gate electrode 57 is formed so as to make contact with the surface of the nitride semiconductor gate layer 56. In the present embodiment, the gate electrode 57 is composed of a TiN layer, and the thickness thereof is about 100 nm.

The passivation film 58 covers the front surface of the second nitride semiconductor layer 5 (excluding the region faced by the contact holes 60 and 61), the side surface of the nitride semiconductor gate layer 56, and the side surface and the front surface of the gate electrode 57. In the present embodiment, the passivation film 58 is formed of a SiN film and has a thickness of about 100 nm.

On the passivation film 58, a barrier metal film 59 is laminated so as to cover the gate portion 70. In the present embodiment, the barrier metal film 59 is formed of a TiN film and has a thickness of about 50 nm.

The source electrode 62 and the drain electrode 63 may include, for example, a lower layer making contact with the second nitride semiconductor layer 5, an intermediate layer laminated on the lower layer, and an upper layer laminated on the intermediate layer. The lower layer may be a Ti layer having a thickness of about 20 nm, the intermediate layer may be an Al layer having a thickness of about 200 nm, and the upper layer may be a TiN layer having a thickness of about 50 nm.

The interlayer-insulating film 64 is made of, for example, SiO$_2$. The thickness of the interlayer-insulating film 64 is about 1 µm. In the interlayer-insulating film 64, a source pad opening 67 for exposing a part of the surface of the source electrode 62 is formed. A source electrode pad 65 covering the source pad opening 67 is formed over the interlayer-insulating film 64. The source electrode pad 65 is formed over substantially the entire region on the interlayer-insulating film 64. A part of the source electrode pad 65 enters the source pad opening 67 and is connected to the source electrode 62 within the source pad opening 67. The source electrode pad 65 is formed of, for example, an Al film, an AlCu film, or the like.

On the interlayer-insulating film 64, there is a removal region where the source electrode pad 65 is not formed. A gate electrode pad (not shown) is formed in this removal region. The gate electrode pad is electrically connected to the gate electrode 57 via a gate wiring (not shown).

In the second nitride semiconductor layer 5, a low resistance region 5a in which Al is diffused is formed in a region directly under the source electrode 62 and a region directly under the drain electrode 63. In the present embodiment, the low resistance region 5a also extends to the surface layer portion of the first nitride semiconductor layer 4.

Between the back surface 2b of the substrate 2 and the second nitride semiconductor layer 5, there is formed a drain pad contact hole 21 extending from the position facing the drain electrode 63 on the back surface 2b of the substrate 2 toward the drain electrode 63 and consecutively penetrating the substrate 2, the buffer layer 3, and the first nitride semiconductor layer 4. In the present embodiment, the upper end of the drain pad contact hole 21 reaches the low resistance region 5a in the second nitride semiconductor layer 5 that is directly under the drain electrode 63.

A drain/contact plug (conductor) 22 having its upper end connected to the low resistance region 5a in the second nitride semiconductor layer 5 directly under the drain electrode 63 is buried in the drain pad contact hole 21. The drain/contact plug 22 includes a barrier metal film 23 formed over the sidewall of the drain pad contact hole 21 and the portion of the second nitride semiconductor layer 5 facing the drain pad contact hole 21, and a metal plug 24 buried in the drain pad contact hole 21 in a state surrounded by the barrier metal film 23. The barrier metal film 23 is made of, for example, TiN. The metal plug 24 is made of, for example, Cu.

The drain electrode pad 66 is formed in substantially the entire region of the back surface 2b of the substrate 2. The drain electrode pad 66 is connected to the lower end of the drain/contact plug 22. Therefore, the drain electrode pad 66 is electrically connected to the drain electrode 63 via a conductive path formed of the drain/contact plug 22 and the low resistance region 5a in the second nitride semiconductor layer 5 directly under the drain electrode 63. The drain electrode pad 66 is made of, for example, Ni, Ag, Ti, Au, or the like.

In the nitride semiconductor device 1B, a second nitride semiconductor layer 5 (electron supply layer) having a different band gap (Al composition) is formed over the first nitride semiconductor layer 4 (electron transit layer) to form a hetero-junction. Thus, a two-dimensional electron gas layer 17 is formed in the first nitride semiconductor layer 4 in the vicinity of the interface between the first nitride semiconductor layer 4 and the second nitride semiconductor layer 5. A HEMT using the two-dimensional electron gas layer 17 as a channel is formed.

The gate electrode 57 faces the second nitride semiconductor layer 5 while sandwiching the nitride semiconductor gate layer 56 formed of a p-type GaN layer. Under the gate electrode 57, the energy levels of the first nitride semiconductor layer 4 and the second nitride semiconductor layer 5 are raised by the ionized acceptors contained in the nitride semiconductor gate layer 56 formed of a p-type GaN layer. Therefore, the energy level of the conduction band at the hetero-junction interface between the first nitride semiconductor layer 4 and the second nitride semiconductor layer 5 is larger than the Fermi level. Accordingly, the two-dimensional electron gas layer 17 caused by the spontaneous polarization of the first nitride semiconductor layer 4 and the second nitride semiconductor layer 5 and the piezo polarization attributable to the lattice mismatch between the first nitride semiconductor layer 4 and the second nitride semiconductor layer 5 is not formed directly under the gate electrode 57 (the gate portion 70).

Therefore, when no bias is applied to the gate electrode 57 (at the time of zero bias), the channel formed by the two-dimensional electron gas layer 17 is blocked directly under the gate electrode 57. Thus, a normally turned-off HEMT is realized. When an appropriate on-voltage (for example, 3 V) is applied to the gate electrode 57, a channel is induced in the first nitride semiconductor layer 4 directly under the gate electrode 57, whereby the two-dimensional electron gas layer 17 on both sides of the gate electrode 57 are connected to each other. As a result, conduction between the source and the drain is established.

When in use, for example, a predetermined voltage (for example, 200 V to 300 V), at which the drain electrode 63 side becomes positive, is applied between the source electrode 62 and the drain electrode 63. In this state, an off-voltage (0 V) or an on-voltage (3 V) is applied to the gate electrode 57 while setting the source electrode 62 at a reference potential (0 V).

In the third embodiment described above, the source electrode pad 65 is formed over one surface side of the nitride semiconductor device 1B, and the drain electrode pad 66 is formed over the other surface side of the nitride semiconductor device 1B. For this reason, it is possible to adopt a general vertical transistor package.

In the third embodiment, the drain pad contact hole 21 may be formed between the back surface 2b of the substrate 2 and the drain electrode 63 so as to consecutively penetrate the substrate 2, the buffer layer 3, the first nitride semiconductor layer 4, and the second nitride semiconductor layer 5. In addition, the drain pad contact hole 21 may be formed between the back surface 2b of the substrate 2 and the first nitride semiconductor layer 4 so as to consecutively penetrate the substrate 2 and the buffer layer 3.

Figure 12:
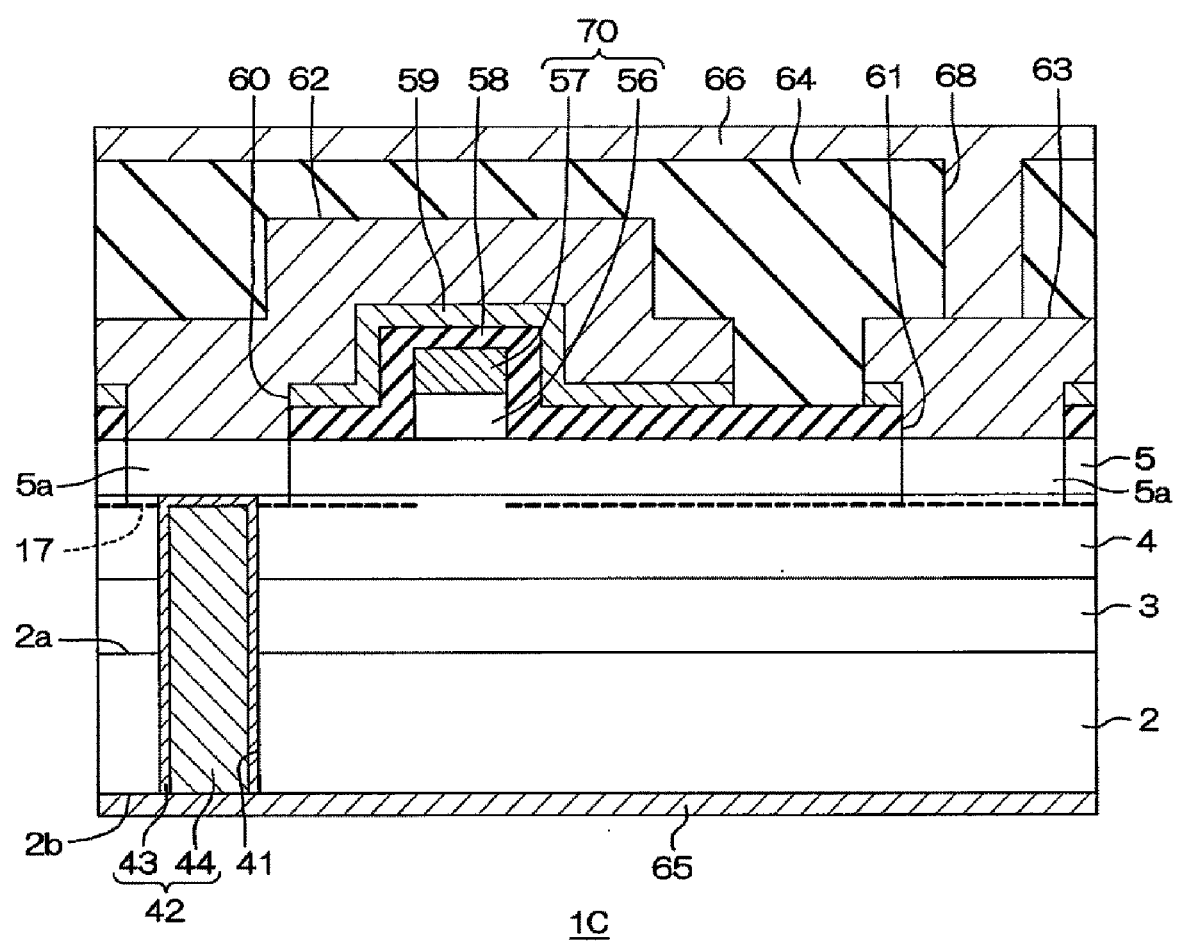
FIG. 12 is a sectional view for explaining a configuration of a nitride semiconductor device according to a fourth embodiment of the present disclosure.

FIG. 12 is a schematic sectional view for explaining a configuration of a nitride semiconductor device according to a fourth embodiment of the present disclosure.

The nitride semiconductor device 1C includes a substrate 2, a buffer layer 3 formed over the front surface 2a of the substrate 2, a first nitride semiconductor layer 4 epitaxially grown on the buffer layer 3, and a second nitride semiconductor layer 5 epitaxially grown on the first nitride semiconductor layer 4. The nitride semiconductor device 1C further includes a gate portion 70 formed over the second nitride semiconductor layer 5.

The nitride semiconductor device 1C further includes a passivation film 58 covering the second nitride semiconductor layer 5 and the gate portion 70, and a barrier metal film 59 laminated on the passivation film 58. The nitride semiconductor device 1C further includes a source electrode 62 and a drain electrode 63 penetrating the source electrode contact hole 60 and the drain electrode contact hole 61 formed in the laminated film of the passivation film 58 and the barrier metal film 59 and making ohmic contact with the second nitride semiconductor layer 5. The source electrode 62 and the drain electrode 63 are spaced apart from each other. The source electrode 62 is formed so as to cover the gate portion 70.

The nitride semiconductor device 1C further includes an interlayer-insulating film 64 that covers the source electrode 62 and the drain electrode 63. The nitride semiconductor device 1C further includes a drain electrode pad 66 formed over the interlayer-insulating film 64 and a source electrode pad 65 formed over the back surface 2b of the substrate 2. In addition to the drain electrode pad 66, a gate electrode pad (not shown) is formed over the interlayer-insulating film 64.

The substrate 2 is formed of a silicon (Si) substrate. In the present embodiment, the substrate 2 is formed of a low resistance silicon substrate. The low resistance silicon substrate may have an impurity concentration of, for example, $1\times10^{17}$ cm$^{-3}$ to $1\times10^{20}$ cm$^{-3}$ (more specifically, about $1\times10^{18}$ cm$^{-3}$). The thickness of the substrate 2 is about 30 μm to 300 μm.

In the present embodiment, the buffer layer 3 is composed of a laminated film of an AlN film making contact with the front surface 2a of the substrate 2 and an AlGaN film laminated on the front surface (the surface opposite to the substrate 2) of the AlN film. The buffer layer 3 may be composed of an AlN film alone or an AlGaN alone.

The first nitride semiconductor layer 4 constitutes an electron transit layer. In the present embodiment, the first nitride semiconductor layer 4 is formed of a GaN layer doped with an acceptor type impurity, and the thickness thereof is about 1.0 μm to 10 μm. The concentration of the acceptor type impurity is preferably $4\times10^{16}$ cm$^{-3}$ or more. In the present embodiment, the acceptor type impurity is C (carbon).

The second nitride semiconductor layer 5 constitutes an electron supply layer. The second nitride semiconductor layer 5 is made of a nitride semiconductor having a larger band gap than the first nitride semiconductor layer 4. Specifically, the second nitride semiconductor layer 5 is made of a nitride semiconductor having a higher Al composition than the first nitride semiconductor layer 4. In the nitride semiconductor, the band gap becomes larger as the Al composition becomes higher. In the present embodiment, the second nitride semiconductor layer 5 is formed of an $Al_{x1}Ga_{1-x1}N$ layer (0<x1<1) and has a thickness of about 10 nm to 100 nm.

In this manner, the first nitride semiconductor layer 4 (electron transit layer) and the second nitride semiconductor layer 5 (electron supply layer) are made of nitride semiconductors having different band gaps (Al compositions). Lattice mismatch occurs between the first nitride semiconductor layer 4 and the second nitride semiconductor layer 5. Due to spontaneous polarization of the first nitride semiconductor layer 4 and the second nitride semiconductor layer 5 and piezo-polarization caused by the lattice mismatch between the first nitride semiconductor layer 4 and the second nitride semiconductor layer 5, the energy level of the conduction band of the first nitride semiconductor layer 4 at the interface between the first nitride semiconductor layer 4 and the second nitride semiconductor layer 5 becomes lower than the Fermi level. As a result, the two-dimensional electron gas (2DEG) layer 17 expands at a position close to the interface between the first nitride semiconductor layer 4 and the second nitride semiconductor layer 5 (for example, a position spaced apart by several A from the interface).

The gate portion 70 includes a nitride semiconductor gate layer 56 epitaxially grown on the second nitride semiconductor layer 5 and a gate electrode 57 formed over the nitride semiconductor gate layer 56. The gate portion 70 is arranged so as to be biased toward the source electrode contact hole 60.

The nitride semiconductor gate layer 56 is made of a nitride semiconductor doped with an acceptor type impurity. In the present embodiment, the nitride semiconductor gate layer 56 is formed of a GaN layer (p-type GaN layer) doped with an acceptor type impurity, and the thickness thereof is about 10 nm to 100 nm. The concentration of the acceptor type impurity implanted into the nitride semiconductor gate layer 56 is preferably $3\times10^{17}$ cm$^{-3}$ or more. In the present embodiment, the acceptor type impurity is Mg (magnesium). The acceptor type impurity may be an acceptor type impurity other than Mg, such as C (carbon) or the like. The nitride semiconductor gate layer 56 is provided for canceling the two-dimensional electron gas layer 17 generated at the interface between the first nitride semiconductor layer 4 (electron transit layer) and the second nitride semiconductor layer 5 (electron supply layer) in the region directly under the gate portion 70.

The gate electrode 57 is formed so as to make contact with the surface of the nitride semiconductor gate layer 56. In the present embodiment, the gate electrode 57 is composed of a TiN layer, and the thickness thereof is about 100 nm.

The passivation film 58 covers the front surface of the second nitride semiconductor layer 5 (excluding the region faced by the contact holes 60 and 61), the side surface of the nitride semiconductor gate layer 56, and the side surface and the front surface of the gate electrode 57. In the present embodiment, the passivation film 58 is formed of a SiN film and has a thickness of about 100 nm.

On the passivation film 58, a barrier metal film 59 is laminated so as to cover the gate portion 70. In the present embodiment, the barrier metal film 59 is formed of a TiN film and has a thickness of about 50 nm.

The source electrode 62 and the drain electrode 63 may include, for example, a lower layer making contact with the second nitride semiconductor layer 5, an intermediate layer laminated on the lower layer, and an upper layer laminated on the intermediate layer. The lower layer may be a Ti layer having a thickness of about 20 nm, the intermediate layer may be an Al layer having a thickness of about 200 nm, and the upper layer may be a TiN layer having a thickness of about 50 nm.

The interlayer-insulating film 64 is made of, for example, $SiO_2$. The thickness of the interlayer-insulating film 64 is about 1 In the interlayer-insulating film 64, a drain pad opening 68 for exposing a part of the surface of the drain electrode 63 is formed. A drain electrode pad 66 covering the drain pad opening 68 is formed over the interlayer-insulating film 64. The drain electrode pad 66 is formed over substantially the entire region on the interlayer-insulating film 64. A part of the drain electrode pad 66 enters the drain pad opening 68 and is connected to the drain electrode 63 within the drain pad opening 68. The drain electrode pad 66 is formed of, for example, an Al film, an AlCu film, or the like.

On the interlayer-insulating film 64, there is a removal region where the drain electrode pad 66 is not formed. A gate electrode pad (not shown) is formed in this removal region. The gate electrode pad is electrically connected to the gate electrode 57 via a gate wiring (not shown).

In the second nitride semiconductor layer 5, a low resistance region 5a in which Al is diffused is formed in a region directly under the source electrode 62 and a region directly under the drain electrode 63. In the present embodiment, the low resistance region 5a also extends to the surface layer portion of the first nitride semiconductor layer 4.

Between the back surface 2b of the substrate 2 and the second nitride semiconductor layer 5, there is formed a source pad contact hole 41 extending from the position facing the source electrode 62 on the back surface 2b of the substrate 2 toward the source electrode 62 and consecutively penetrating the substrate 2, the buffer layer 3, and the first nitride semiconductor layer 4. In the present embodiment, the upper end of the source pad contact hole 41 reaches the low resistance region 5a in the second nitride semiconductor layer 5 that is directly under the source electrode 62.

A source/contact plug (conductor) 42 having its upper end connected to the low resistance region 5a in the second nitride semiconductor layer 5 directly under the source electrode 62 is buried in the source pad contact hole 41. The source/contact plug 42 includes a barrier metal film 43 formed over the sidewall of the source pad contact hole 41 and the portion of the second nitride semiconductor layer 5 facing the source pad contact hole 41, and a metal plug 44 buried in the source pad contact hole 41 in a state surrounded by the barrier metal film 43. The barrier metal film 43 is made of, for example, TiN. The metal plug 44 is made of, for example, Cu.

The source electrode pad 65 is formed in substantially the entire region of the back surface 2b of the substrate 2. The source electrode pad 65 is connected to the lower end of the source/contact plug 42. Therefore, the source electrode pad 65 is electrically connected to the source electrode 62 via a conductive path formed of the source/contact plug 42 and the low resistance region 5a in the second nitride semiconductor layer 5 directly under the source electrode 62. The source electrode pad 65 is made of, for example, Ni, Ag, Ti, Au, or the like.

In the nitride semiconductor device 1C, a second nitride semiconductor layer 5 (electron supply layer) having a different band gap (Al composition) is formed over the first nitride semiconductor layer 4 (electron transit layer) to form a hetero-junction. Thus, a two-dimensional electron gas layer 17 is formed in the first nitride semiconductor layer 4 in the vicinity of the interface between the first nitride semiconductor layer 4 and the second nitride semiconductor layer 5. A HEMT using the two-dimensional electron gas layer 17 as a channel is formed.

The gate electrode 57 faces the second nitride semiconductor layer 5 while sandwiching the nitride semiconductor gate layer 56 formed of a p-type GaN layer. Under the gate electrode 57, the energy levels of the first nitride semiconductor layer 4 and the second nitride semiconductor layer 5 are raised by the ionized acceptors contained in the nitride semiconductor gate layer 56 formed of a p-type GaN layer. Therefore, the energy level of the conduction band at the hetero-junction interface between the first nitride semiconductor layer 4 and the second nitride semiconductor layer 5 is larger than the Fermi level. Accordingly, the two-dimensional electron gas layer 17 caused by the spontaneous polarization of the first nitride semiconductor layer 4 and the second nitride semiconductor layer 5 and the piezo polarization attributable to the lattice mismatch between the first nitride semiconductor layer 4 and the second nitride semiconductor layer 5 is not formed directly under the gate electrode 57 (the gate portion 70).

Therefore, when no bias is applied to the gate electrode 57 (at the time of zero bias), the channel formed by the two-dimensional electron gas layer 17 is blocked directly under the gate electrode 57. Thus, a normally turned-off HEMT is realized. When an appropriate on-voltage (for example, 3 V) is applied to the gate electrode 57, a channel is induced in the first nitride semiconductor layer 4 directly under the gate electrode 57, whereby the two-dimensional electron gas layer 17 on both sides of the gate electrode 57 are connected to each other. As a result, conduction between the source and the drain is established.

When in use, for example, a predetermined voltage (for example, 200 V to 300 V) at which the drain electrode 63 side becomes positive is applied to between the source electrode 62 and the drain electrode 63. In this state, an off-voltage (0 V) or an on-voltage (3 V) is applied to the gate electrode 57 while setting the source electrode 62 at a reference potential (0 V).

In the fourth embodiment described above, the drain electrode pad 66 is formed over one surface side of the nitride semiconductor device 1C, and the source electrode pad 65 is formed over the other surface side of the nitride semiconductor device 1C. For this reason, it is possible to adopt a general vertical transistor package.

In the fourth embodiment, the source pad contact hole 41 may be formed between the back surface 2b of the substrate 2 and the source electrode 62 so as to consecutively penetrate the substrate 2, the buffer layer 3, the first nitride semiconductor layer 4, and the second nitride semiconductor layer 5. In addition, the source pad contact hole 41 may be formed between the back surface 2b of the substrate 2 and the first nitride semiconductor layer 4 so as to consecutively penetrate the substrate 2 and the buffer layer 3.

Although the first to fourth embodiments of the present disclosure have been described above, the present disclosure may be implemented in other embodiments. For example, in the first to fourth embodiments described above, there has been described an example in which the first nitride semiconductor layer (electron traveling layer) 4 is formed of a GaN layer and the second nitride semiconductor layer (electron supply layer) 5 is formed of an AlGaN layer. However, it suffices that the first nitride semiconductor layer 4 and the second nitride semiconductor layer 5 have different band gaps (for example, Al compositions). Other combinations may also be adopted. Examples of the combination of the first nitride semiconductor layer 4/the second nitride semiconductor layer 5 may include GaN/AlN, AlGaN/AlN or the like.

In the first to fourth embodiments described above, silicon is exemplified as an example of the material of the substrate 2. However, any other substrate material such as sapphire or GaN may also be applied.

In addition, various design changes may be made within the scope of the matters described in the claims.

According to some embodiments of the present disclosure, it is possible to adopt a general vertical transistor package.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A nitride semiconductor device, comprising:
   a Si substrate including a front surface and a back surface;
   a buffer layer formed over the front surface of the Si substrate;
   a first nitride semiconductor layer formed over the buffer layer and configured to constitute an electron transit layer;
   a second nitride semiconductor layer formed over the first nitride semiconductor layer and configured to constitute an electron supply layer;
   a gate electrode disposed over the second nitride semiconductor layer;

a source electrode and a drain electrode electrically connected to the second nitride semiconductor layer, and disposed over the second nitride semiconductor layer to be spaced apart from the gate electrode that is interposed between the source electrode and the drain electrode;

a back surface electrode pad formed over the back surface of the Si substrate; and a conductive path formed in the Si substrate, the buffer layer, the first nitride semiconductor layer, and the second nitride semiconductor layer, and configured to electrically connect one of the source electrode and the drain electrode to the back surface electrode pad, wherein a low resistance region is formed in the second nitride semiconductor layer directly under a back-surface-drawing target electrode, and a thickness of the low resistance region is substantially the same as a thickness of the second nitride semiconductor layer.

2. The device of claim 1, wherein the back-surface-drawing target electrode is the one of the source electrode and the drain electrode electrically connected to the back surface electrode pad, and wherein the conductive path includes:

a contact hole extending from a position, which faces the back-surface-drawing target electrode, on the back surface of the Si substrate toward the back-surface-drawing target electrode and consecutively penetrating at least the Si substrate and the buffer layer among the Si substrate, the buffer layer, the first nitride semiconductor layer, and the second nitride semiconductor layer; and a conductive material buried in the contact hole.

3. The device of claim 2, wherein the contact hole consecutively penetrates the Si substrate, the buffer layer, and the first nitride semiconductor layer, without being formed in the second nitride semiconductor layer.

4. The device of claim 2, wherein the contact hole consecutively penetrates the Si substrate, the buffer layer, the first nitride semiconductor layer, and the second nitride semiconductor layer.

5. The device of claim 1, further comprising:

a source field plate disposed between the gate electrode and the drain electrode and electrically connected to the source electrode.

6. The device of claim 1, wherein the first nitride semiconductor layer is formed of a GaN layer, and the second nitride semiconductor layer is formed of an AlGaN layer.

7. The device of claim 6, wherein the buffer layer includes a laminated film of an AlN layer formed over the front surface of the Si substrate and an AlGaN layer laminated on the AlN layer.

8. The device of claim 6, wherein the buffer layer includes an AlN layer or an AlGaN layer.

9. The device of claim 1, wherein the conductive path includes a metal plug and a barrier metal film that surrounds the metal plug.

10. The device of claim 9, wherein the barrier metal film is made of TiN, and the metal plug is made of Cu.

11. A nitride semiconductor device, comprising:

a Si substrate including a front surface and a back surface;

a buffer layer formed over the front surface of the Si substrate;

a first nitride semiconductor layer formed over the buffer layer and configured to constitute an electron transit layer;

a second nitride semiconductor layer formed over the first nitride semiconductor layer and configured to constitute an electron supply layer;

a gate electrode disposed over the second nitride semiconductor layer;

a source electrode and a drain electrode electrically connected to the second nitride semiconductor layer, and disposed over the second nitride semiconductor layer to be spaced apart from the gate electrode that is interposed between the source electrode and the drain electrode;

a drain electrode pad formed over the back surface of the Si substrate; and a conductive path formed in the Si substrate, the buffer layer, the first nitride semiconductor layer, and the second nitride semiconductor layer, and configured to electrically connect the drain electrode to the drain electrode pad, wherein a low resistance region is formed in the second nitride semiconductor layer directly under the drain electrode, and a thickness of the low resistance region is substantially the same as a thickness of the second nitride semiconductor layer.

12. The device of claim 11, wherein the conductive path includes:

a contact hole extending from a position, which faces the drain electrode, on the back surface of the Si substrate toward the drain electrode and consecutively penetrating at least the Si substrate and the buffer layer among the Si substrate, the buffer layer, the first nitride semiconductor layer, and the second nitride semiconductor layer; and a conductive material buried in the contact hole.

13. The device of claim 12, wherein the contact hole consecutively penetrates the Si substrate, the buffer layer, and the first nitride semiconductor layer, without being formed in the second nitride semiconductor layer.

14. The device of claim 12, wherein the contact hole consecutively penetrates the Si substrate, the buffer layer, the first nitride semiconductor layer, and the second nitride semiconductor layer.

15. The device of claim 11, wherein the conductive path includes a metal plug and a barrier metal film that surrounds the metal plug.

16. The device of claim 15, wherein the barrier metal film is made of TiN, and the metal plug is made of Cu.

17. A nitride semiconductor device, comprising:

a Si substrate including a front surface and a back surface;

a buffer layer formed over the front surface of the Si substrate;

a first nitride semiconductor layer formed over the buffer layer and configured to constitute an electron transit layer;

a second nitride semiconductor layer formed over the first nitride semiconductor layer and configured to constitute an electron supply layer;

a gate electrode disposed over the second nitride semiconductor layer;

a source electrode and a drain electrode electrically connected to the second nitride semiconductor layer, and disposed over the second nitride semiconductor layer to be spaced apart from the gate electrode that is interposed between the source electrode and the drain electrode;

a source electrode pad formed over the back surface of the Si substrate; and a conductive path formed in the Si substrate, the buffer layer, the first nitride semiconductor layer, and the second nitride semiconductor layer, and configured to electrically connect the source electrode to the source electrode pad, wherein a low resistance region is formed in the second nitride semiconductor layer directly under the source electrode, and a thickness of the low resistance region is substantially the same as a thickness of the second nitride semiconductor layer.

18. The device of claim 17, wherein the conductive path includes:
   a contact hole extending from a position, which faces the source electrode, on the back surface of the Si substrate toward the source electrode and consecutively penetrating at least the Si substrate and the buffer layer among the Si substrate, the buffer layer, the first nitride semiconductor layer, and the second nitride semiconductor layer; and
   a conductive material buried in the contact hole.

19. The device of claim 18, wherein the contact hole consecutively penetrates the Si substrate, the buffer layer, and the first nitride semiconductor layer, without being formed in the second nitride semiconductor layer.

20. The device of claim 18, wherein the contact hole consecutively penetrates the Si substrate, the buffer layer, the first nitride semiconductor layer, and the second nitride semiconductor layer.

21. The device of claim 17, wherein the conductive path includes a metal plug and a barrier metal film that surrounds the metal plug.

22. The device of claim 21, wherein the barrier metal film is made of TiN, and the metal plug is made of Cu.

23. A nitride semiconductor device, comprising:
   a Si substrate including a front surface and a back surface;
   a buffer layer formed over the front surface of the Si substrate;
   a first nitride semiconductor layer formed over the buffer layer and configured to constitute an electron transit layer;
   a second nitride semiconductor layer formed over the first nitride semiconductor layer and configured to constitute an electron supply layer;
   a gate portion disposed over the second nitride semiconductor layer;
   a source electrode and a drain electrode electrically connected to the second nitride semiconductor layer and disposed over the second nitride semiconductor layer, the source electrode formed to cover the gate portion;
   a drain electrode pad formed over the back surface of the Si substrate; and
   a conductive path formed in the Si substrate, the buffer layer, the first nitride semiconductor layer, and the second nitride semiconductor layer, and configured to electrically connect the drain electrode to the drain electrode pad, wherein the gate portion includes a nitride semiconductor gate layer disposed over the second nitride semiconductor layer and containing an acceptor type impurity, and a gate electrode disposed over the nitride semiconductor gate layer, and wherein a low resistance region is formed in the second nitride semiconductor layer directly under the drain electrode, and a thickness of the low resistance region is substantially the same as a thickness of the second nitride semiconductor layer.

24. The device of claim 23, wherein the conductive path includes a metal plug and a barrier metal film that surrounds the metal plug.

25. The device of claim 24, wherein the barrier metal film is made of TiN, and the metal plug is made of Cu.

26. A nitride semiconductor device, comprising:
   a Si substrate including a front surface and a back surface;
   a buffer layer formed over the front surface of the Si substrate;
   a first nitride semiconductor layer formed over the buffer layer and configured to constitute an electron transit layer;
   a second nitride semiconductor layer formed over the first nitride semiconductor layer and configured to constitute an electron supply layer;
   a gate portion disposed over the second nitride semiconductor layer;
   a source electrode and a drain electrode electrically connected to the second nitride semiconductor layer and disposed over the second nitride semiconductor layer, the source electrode formed to cover the gate portion;
   a source electrode pad formed over the back surface of the Si substrate; and
   a conductive path formed in the Si substrate, the buffer layer, the first nitride semiconductor layer, and the second nitride semiconductor layer, and configured to electrically connect the source electrode to the source electrode pad, wherein the gate portion includes a nitride semiconductor gate layer disposed over the second nitride semiconductor layer and containing an acceptor type impurity, and a gate electrode disposed over the nitride semiconductor gate layer, and wherein a low resistance region is formed in the second nitride semiconductor layer directly under the source electrode, and a thickness of the low resistance region is substantially the same as a thickness of the second nitride semiconductor layer.

27. The device of claim 26, wherein the conductive path includes a metal plug and a barrier metal film that surrounds the metal plug.

28. The device of claim 27, wherein the barrier metal film is made of TiN, and the metal plug is made of Cu.

* * * * *